United States Patent
Kroeger et al.

(10) Patent No.: US 9,479,197 B2
(45) Date of Patent: Oct. 25, 2016

(54) METHOD AND APPARATUS FOR TRANSMISSION AND RECEPTION OF IN-BAND ON-CHANNEL RADIO SIGNALS INCLUDING COMPLEMENTARY LOW DENSITY PARITY CHECK CODING

(71) Applicant: iBiquity Digital Corporation, Columbia, MD (US)

(72) Inventors: Brian W. Kroeger, Sykesville, MD (US); Paul J. Peyla, Elkridge, MD (US)

(73) Assignee: iBiquity Digital Corporation, Columbia, MD (US)

(*) Notice: Subject to any disclaimer, the term of this patent is extended or adjusted under 35 U.S.C. 154(b) by 0 days.

(21) Appl. No.: 14/817,423

(22) Filed: Aug. 4, 2015

(65) Prior Publication Data
US 2015/0341049 A1  Nov. 26, 2015

Related U.S. Application Data

(62) Division of application No. 13/835,011, filed on Mar. 15, 2013, now Pat. No. 9,136,874.

(51) Int. Cl.
*H03M 13/11* (2006.01)
*H04L 1/00* (2006.01)
(Continued)

(52) U.S. Cl.
CPC .......... *H03M 13/1105* (2013.01); *G06F 11/10* (2013.01); *H03M 13/1102* (2013.01); *H03M 13/255* (2013.01); *H03M 13/2906* (2013.01); *H03M 13/31* (2013.01); *H03M 13/63* (2013.01); *H03M 13/6362* (2013.01); *H04H 20/30* (2013.01); *H04L 1/0013* (2013.01); *H04L 1/0041* (2013.01); *H04L 1/0045* (2013.01);
(Continued)

(58) Field of Classification Search
CPC ............... H03M 13/1102; H03M 13/1154; H03M 13/1515; H03M 13/255; H03M 13/2906; H03M 13/31; H03M 13/63; H03M 13/6362; H04H 20/30; H04H 2201/18; H04L 1/0013; H04L 1/0057; H04L 1/0071; H04L 1/04; H04L 1/08; H04L 5/0044
USPC ....... 714/758, 786, 776, 752, 790, 799, 821; 370/487, 529; 375/265, 34
See application file for complete search history.

(56) References Cited

U.S. PATENT DOCUMENTS 6,549,544 B1   4/2003   Kroeger et al.
6,982,948 B2   1/2006   Kroeger et al.
(Continued)

OTHER PUBLICATIONS

Tang, Heng et al., "On Algebraic Construction of Gallager and Circulant Low-Density Parity-Check Codes", IEEE Transactions on Information Theory, Jun. 2004, vol. 50, No. 6, pp. 1269-1279.

(Continued)

*Primary Examiner* — John J Tabone, Jr.
(74) *Attorney, Agent, or Firm* — Robert P. Lenart, Esq.; Pietragallo Gordon Alfano Bosick & Raspanti, LLP

(57) ABSTRACT

A method includes: constructing complementary low density parity check codewords by generating a first codeword having a first code rate; and partitioning the first codeword by assigning groups of bits of the first codeword to four quarter-partitions, wherein each of the quarter partitions includes bits in one half of one of four independently decodable semi-codewords each having a second code rate that is larger than the first code rate. Receivers that receive signals produced by the method are also disclosed.

15 Claims, 17 Drawing Sheets

(51) Int. Cl.

| | |
|---|---|
| *H03M 13/29* | (2006.01) |
| *G06F 11/10* | (2006.01) |
| *H03M 13/25* | (2006.01) |
| *H04H 20/30* | (2008.01) |
| *H04L 1/04* | (2006.01) |
| *H04L 5/00* | (2006.01) |
| *H03M 13/31* | (2006.01) |
| *H03M 13/00* | (2006.01) |
| *H04L 27/26* | (2006.01) |
| *H04L 1/08* | (2006.01) |
| *H03M 13/15* | (2006.01) |

(52) U.S. Cl.
CPC .......... *H04L 1/0057* (2013.01); *H04L 1/0063* (2013.01); *H04L 1/0068* (2013.01); *H04L 1/0071* (2013.01); *H04L 1/04* (2013.01); *H04L 5/0044* (2013.01); *H04L 27/2697* (2013.01); *H03M 13/1154* (2013.01); *H03M 13/1515* (2013.01); *H04H 2201/18* (2013.01); *H04L 1/08* (2013.01); *H04L 2001/0093* (2013.01)

(56) References Cited

U.S. PATENT DOCUMENTS

| | | | |
|---|---|---|---|
| 7,043,681 B2 | 5/2006 | Kroeger | |
| 7,305,043 B2 | 12/2007 | Milbar et al. | |
| 7,305,056 B2 | 12/2007 | Kroeger | |
| 7,352,817 B2 | 4/2008 | Milbar | |
| 7,464,324 B2 | 12/2008 | Kroeger et al. | |
| 7,590,920 B2 * | 9/2009 | Yang | H03M 13/2906 714/774 |
| 7,933,368 B2 | 4/2011 | Peyla et al. | |
| 8,111,716 B2 | 2/2012 | Iannuzzelli et al. | |
| 8,190,963 B1 * | 5/2012 | Wu | H03M 13/2906 714/755 |
| 8,595,590 B1 * | 11/2013 | Vojcic | H04L 1/0041 375/262 |
| 2001/0050926 A1 * | 12/2001 | Kumar | H04H 20/30 370/529 |
| 2003/0021341 A1 * | 1/2003 | Vigil | H04N 5/211 375/240.01 |
| 2003/0212946 A1 * | 11/2003 | Kroeger | H03M 13/25 714/786 |
| 2005/0163256 A1 * | 7/2005 | Kroeger | H04H 20/30 375/300 |
| 2007/0019578 A1 * | 1/2007 | Meiri | H04L 1/0045 370/311 |
| 2007/0044006 A1 * | 2/2007 | Yang | G11B 20/1833 714/785 |
| 2008/0175331 A1 * | 7/2008 | Kroeger | H04B 1/406 375/261 |
| 2008/0263428 A1 * | 10/2008 | Eerenberg | H04L 49/90 714/762 |
| 2009/0006926 A1 * | 1/2009 | Koppelaar | H03M 13/09 714/762 |
| 2009/0268648 A1 * | 10/2009 | Tardy | H04H 20/16 370/310 |
| 2013/0091397 A1 * | 4/2013 | Xia | H03M 13/6502 714/752 |
| 2013/0091400 A1 * | 4/2013 | Xia | H03M 13/1102 714/755 |
| 2014/0153625 A1 * | 6/2014 | Vojcic | H04L 1/005 375/224 |

OTHER PUBLICATIONS

Chui, J. et al., "Design of Cross-Packet Channel Coding with Low-Density Parity-Check Codes", Information Theory for Wireless Networks, 2007 IEEE Information Theory Workshop, Jul. 1, 2007, pp. 1-5.

* cited by examiner

METHOD AND APPARATUS FOR TRANSMISSION AND RECEPTION OF IN-BAND ON-CHANNEL RADIO SIGNALS INCLUDING COMPLEMENTARY LOW DENSITY PARITY CHECK CODING

CROSS REFERENCE TO A RELATED APPLICATION

This application is a divisional application of U.S. patent application Ser. No. 13/835,011, filed Mar. 15, 2013, and titled "Method And Apparatus For Transmission And Reception Of In-Band On-Channel Radio Signals Including Complementary Low Density Parity Coding", which is hereby incorporated by reference.

FIELD OF THE INVENTION

This invention relates to methods and apparatus for transmission and reception of radio signals in a digital radio broadcasting system.

BACKGROUND OF THE INVENTION

Digital radio broadcasting technology delivers digital audio and data services to mobile, portable, and fixed receivers. One type of digital radio broadcasting, referred to as in-band on-channel (IBOC) digital audio broadcasting (DAB), uses terrestrial transmitters in the existing Medium Frequency (MF) and Very High Frequency (VHF) radio bands. HD Radio™ technology, developed by iBiquity Digital Corporation, is one example of an IBOC implementation for digital radio broadcasting and reception. IBOC DAB signals can be transmitted in a hybrid format including an analog modulated carrier in combination with a plurality of digitally modulated carriers or in an all-digital format wherein the analog modulated carrier is not used. Using the hybrid mode, broadcasters may continue to transmit analog AM and FM simultaneously with higher-quality and more robust digital signals, allowing themselves and their listeners to convert from analog-to-digital radio while maintaining their current frequency allocations.

One feature of digital transmission systems is the inherent ability to simultaneously transmit both digitized audio and data. Thus the technology also allows for wireless data services from AM and FM radio stations. The broadcast signals can include metadata, such as the artist, song title, or station call letters. Special messages about events, traffic, and weather can also be included. For example, traffic information, weather forecasts, news, and sports scores can all be scrolled across a radio receiver's display while the user listens to a radio station.

The design provides a flexible means of transitioning to a digital broadcast system by providing three new waveform types: Hybrid, Extended Hybrid, and All-Digital. The Hybrid and Extended Hybrid types retain the analog FM signal, while the All-Digital type does not. All three waveform types conform to the currently allocated spectral emissions mask.

The digital signal is modulated using Orthogonal Frequency Division Multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

The HD Radio system allows multiple services to share the broadcast capacity of a single station. One feature of digital transmission systems is the inherent ability to simultaneously transmit both digitized audio and data. Thus the technology also allows for wireless data services from AM and FM radio stations. First generation (core) services include a Main Program Service (MPS) and the Station Information Service (SIS). Second generation services, referred to as Advanced Application Services (AAS), include new information services providing, for example, multicast programming, electronic program guides, navigation maps, traffic information, multimedia programming and other content. The AAS Framework provides a common infrastructure to support the developers of these services. The AAS Framework provides a platform for a large number of service providers and services for terrestrial radio. It has opened up numerous opportunities for a wide range of services (both audio and data) to be deployed through the system.

The National Radio Systems Committee, a standard-setting organization sponsored by the National Association of Broadcasters and the Consumer Electronics Association, adopted an IBOC standard, designated NRSC-5A, in September 2005. NRSC-5A, the disclosure of which is incorporated herein by reference, sets forth the requirements for broadcasting digital audio and ancillary data over AM and FM broadcast channels. The current version of the standard is NRSC-5C, which is also hereby incorporated by reference. The standard and its reference documents contain detailed explanations of the RF/transmission subsystem and the transport and service multiplex subsystems.

SUMMARY

In a first aspect, the invention provides a method of transmitting digital information, including: constructing complementary low density parity check codewords by generating a first codeword having a first code rate; and partitioning the first codeword by assigning groups of bits of the first codeword to four quarter-partitions, wherein each of the quarter partitions includes bits in one half of one of four independently decodable semi-codewords each having a second code rate that is larger than the first code rate.

In another aspect, the invention provides a method including: constructing complementary low density parity check codewords by generating a first semi-codeword including information bits and first parity bits; permuting and re-encoding the information bits of the first semi-codeword to produce second parity check bits and forming a second semi-codeword including the information bits and second parity bits; generating a third semi-codeword from the information bits of the first semi-codeword plus a first half of the parity bits from each of the first semi-codeword and the second semi-codeword; and generating a fourth semi-codeword from the information bits of the first semi-codeword plus a second half of the parity bits from each of the first semi-codeword and the second semi-codeword.

In another aspect, the invention provides a receiver for receiving a digital radio signal. The receiver includes an input for receiving a radio signal including at least one carrier, the carrier being modulated by plurality of information bits representing audio information and/or data encoded in a composite codeword and a plurality of complementary low density parity check codewords including a first codeword having a first code rate; wherein the first codeword is partitioned by in groups of bits of the first codeword in four quarter-partitions, and wherein each of the quarter partitions includes bits in one half of one of four independently decodable semi-codewords each having a second code rate that is larger than the first code rate; and a processor for producing an output signal in response to the received radio signal.

DETAILED DESCRIPTION

Figure 1:
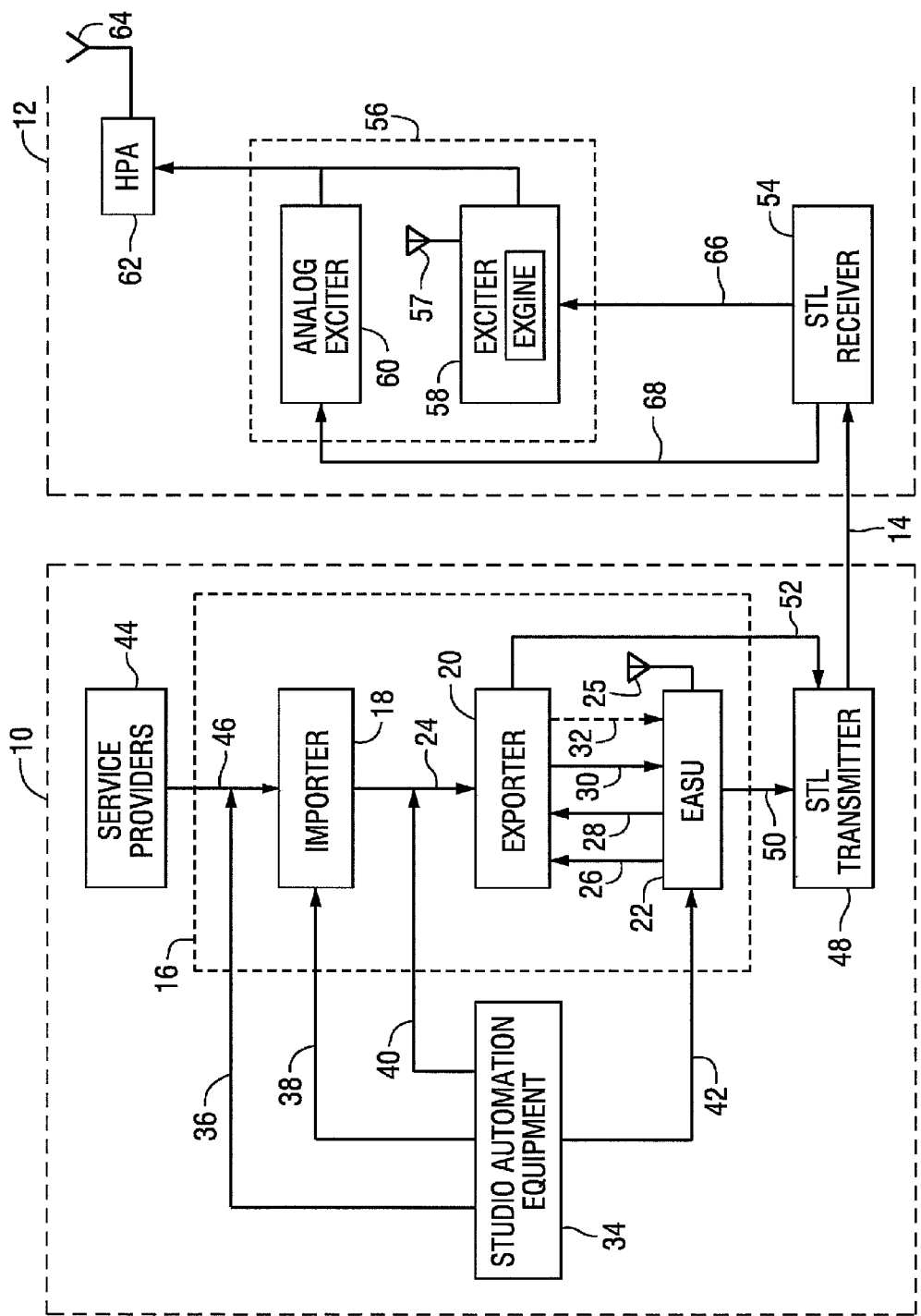
FIG. 1 is a block diagram of a transmission system for use in an in-band on-channel digital radio broadcasting system.

Referring to the drawings, FIG. 1 is a functional block diagram of the relevant components of a studio site 10, an FM transmitter site 12, and a studio transmitter link (STL) 14 that can be used to broadcast an FM IBOC signal. The studio site includes, among other things, studio automation equipment 34, an Ensemble Operations Center (EOC) 16 that includes an importer 18, an exporter 20, an exciter auxiliary service unit (EASU) 22, and an STL transmitter 48. The transmitter site includes an STL receiver 54, a digital exciter 56 that includes an exciter engine (exgine) subsystem 58, and an analog exciter 60. While in FIG. 1 the exporter is resident at a radio station's studio site and the exciter is located at the transmission site, these elements may be co-located at the transmission site.

At the studio site, the studio automation equipment supplies main program service (MPS) audio 42 to the EASU, MPS data 40 to the exporter, supplemental program service (SPS) audio 38 to the importer, and SPS data 36 to the importer. MPS audio serves as the main audio programming source. In hybrid modes, it preserves the existing analog radio programming formats in both the analog and digital transmissions. MPS data, also known as program service data (PSD), includes information such as music title, artist, album name, etc. Supplemental program service can include supplementary audio content as well as program associated data.

The importer contains hardware and software for supplying advanced application services (AAS). A "service" is content that is delivered to users via an IBOC broadcast, and AAS can include any type of data that is not classified as MPS, SPS, or Station Information Service (SIS). SIS provides station information, such as call sign, absolute time, position correlated to GPS, etc. Examples of AAS data include real-time traffic and weather information, navigation map updates or other images, electronic program guides, multimedia programming, other audio services, and other content. The content for AAS can be supplied by service providers 44, which provide service data 46 to the importer via an application program interface (API). The service providers may be a broadcaster located at the studio site or externally sourced third-party providers of services and content. The importer can establish session connections between multiple service providers. The importer encodes and multiplexes service data 46, SPS audio 38, and SPS data 36 to produce exporter link data 24, which is output to the exporter via a data link.

The exporter 20 contains the hardware and software necessary to supply the main program service and SIS for broadcasting. The exporter accepts digital MPS audio 26 over an audio interface and compresses the audio. The exporter also multiplexes MPS data 40, exporter link data 24, and the compressed digital MPS audio to produce exciter link data 52. In addition, the exporter accepts analog MPS audio 28 over its audio interface and applies a pre-programmed delay to it to produce a delayed analog MPS audio signal 30. This analog audio can be broadcast as a backup channel for hybrid IBOC broadcasts. The delay compensates for the system delay of the digital MPS audio, allowing receivers to blend between the digital and analog program without a shift in time. In an AM transmission system, the delayed MPS audio signal 30 is converted by the exporter to a mono signal and sent directly to the STL as part of the exciter link data 52.

The EASU 22 accepts MPS audio 42 from the studio automation equipment, rate converts it to the proper system clock, and outputs two copies of the signal, one digital (26) and one analog (28). The EASU includes a GPS receiver that is connected to an antenna 25. The GPS receiver allows the EASU to derive a master clock signal, which is synchronized to the exciter's clock by use of GPS units. The EASU provides the master system clock used by the exporter. The EASU is also used to bypass (or redirect) the analog MPS audio from being passed through the exporter in the event the exporter has a catastrophic fault and is no longer operational. The bypassed audio 32 can be fed directly into the STL transmitter, eliminating a dead-air event.

STL transmitter 48 receives delayed analog MPS audio 50 and exciter link data 52. It outputs exciter link data and delayed analog MPS audio over STL link 14, which may be either unidirectional or bidirectional. The STL link may be a digital microwave or Ethernet link, for example, and may use the standard User Datagram Protocol or the standard TCP/IP.

The transmitter site includes an STL receiver 54, an exciter 56 and an analog exciter 60. The STL receiver 54 receives exciter link data, including audio and data signals as well as command and control messages, over the STL link 14. The exciter link data is passed to the exciter 56, which produces the IBOC waveform. The exciter includes a host processor, digital up-converter, RF up-converter, and exgine subsystem 58. The exgine accepts exciter link data and modulates the digital portion of the IBOC waveform. The digital up-converter of exciter 56 converts from digital-to-analog the baseband portion of the exgine output. The digital-to-analog conversion is based on a GPS clock, common to that of the exporter's GPS-based clock derived from the EASU. Thus, the exciter 56 includes a GPS unit and antenna 57. The RF up-converter of the exciter up-converts the analog signal to the proper in-band channel frequency. The upconverted signal is then passed to the high power amplifier 62 and antenna 64 for broadcast. In an AM transmission system, the exgine subsystem coherently adds the backup analog MPS audio to the digital waveform in the hybrid mode; thus, the AM transmission system does not include the analog exciter 60. In addition, the exciter 56 produces phase and magnitude information and the analog signal is output directly to the high power amplifier.

Signal processing in both transmitters and receivers of an IBOC radio system can be implemented using a multi-layer logical protocol stack. An example of a logical protocol stack is shown in U.S. Pat. No. 8,111,716, which is hereby incorporated by reference. The signal processing described in FIG. 5 below can be performed in Layer 1 (i.e., the physical layer) of the logical protocol stack.

IBOC signals can be transmitted in both AM and FM radio bands, using a variety of waveforms. The waveforms include an FM hybrid IBOC waveform, an FM all-digital IBOC waveform, an AM hybrid IBOC waveform, and an AM all-digital IBOC waveform.

Figure 2:
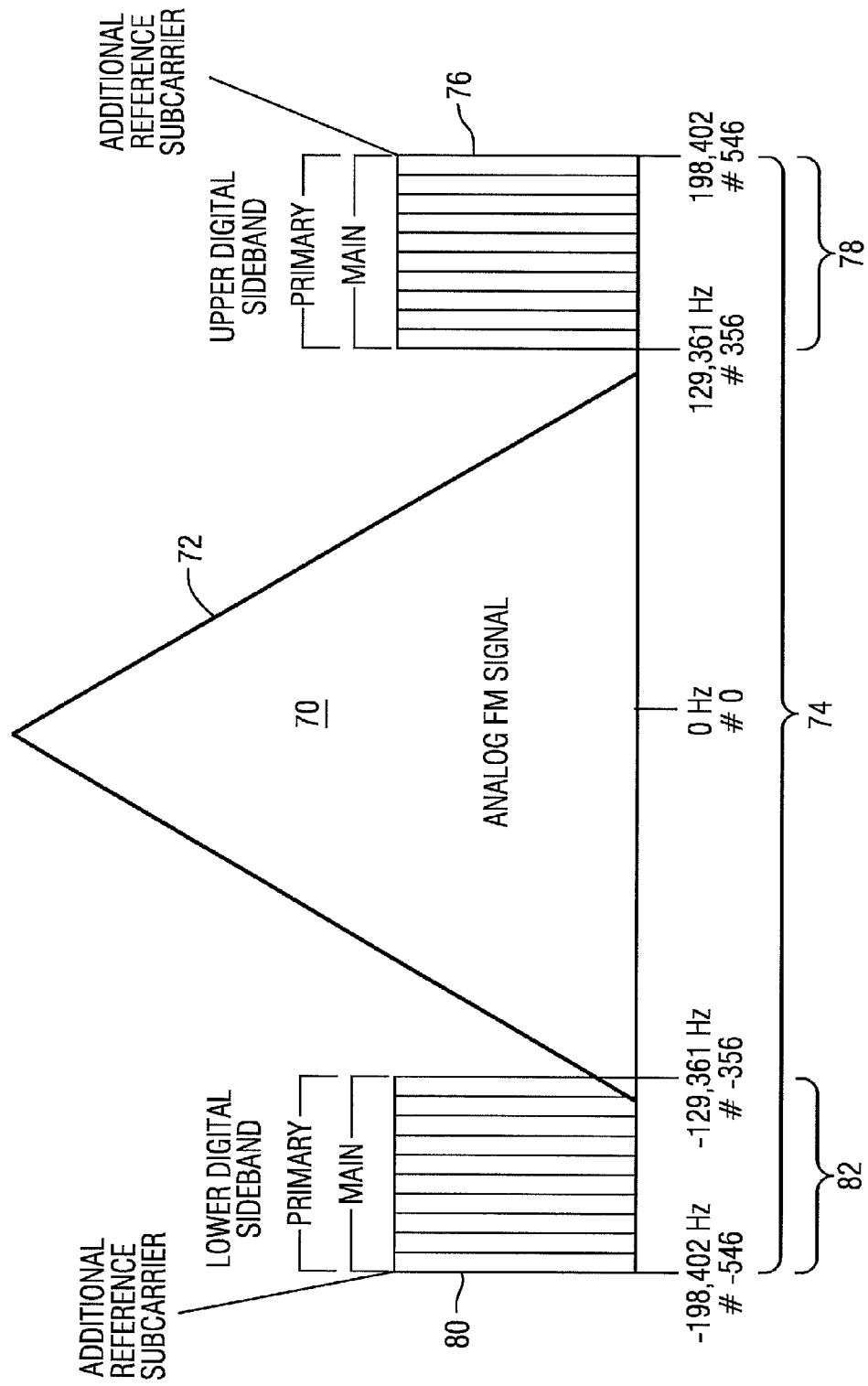
FIG. 2 is a schematic representation of a hybrid FM IBOC waveform.

FIG. 2 is a schematic representation of a hybrid FM IBOC waveform 70. The waveform includes an analog modulated signal 72 located in the center of a broadcast channel 74, a first plurality of evenly spaced orthogonally frequency division multiplexed subcarriers 76 in an upper sideband 78, and a second plurality of evenly spaced orthogonally frequency division multiplexed subcarriers 80 in a lower sideband 82. The digitally modulated subcarriers are divided into partitions and various subcarriers are designated as reference subcarriers. A frequency partition is a group of 19 OFDM subcarriers containing 18 data subcarriers and one reference subcarrier.

The hybrid waveform includes an analog FM-modulated signal, plus digitally modulated primary main subcarriers. The subcarriers are located at evenly spaced frequency locations. The subcarrier locations are numbered from −546 to +546. In the waveform of FIG. 2, the subcarriers are at locations +356 to +546 and −356 to −546. Each primary main sideband is comprised of ten frequency partitions. Subcarriers 546 and −546, also included in the primary main sidebands, are additional reference subcarriers. The amplitude of each subcarrier can be scaled by an amplitude scale factor.

Figure 3:
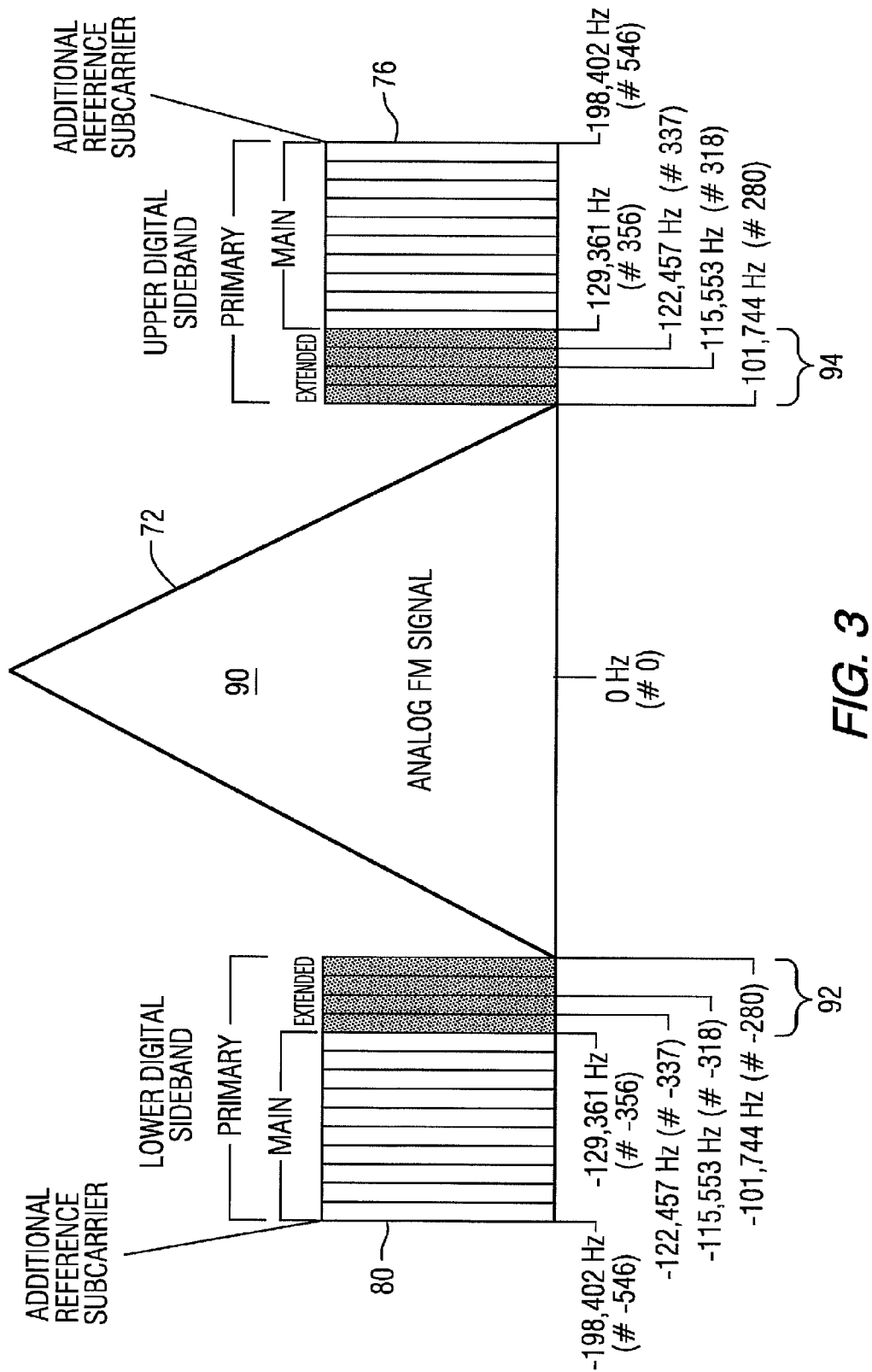
FIG. 3 is a schematic representation of another hybrid FM IBOC waveform.

FIG. 3 is a schematic representation of an extended hybrid FM IBOC waveform 90. The extended hybrid waveform is created by adding primary extended sidebands 92, 94 to the primary main sidebands present in the hybrid waveform. One, two, or four frequency partitions can be added to the inner edge of each primary main sideband. The extended hybrid waveform includes the analog FM signal plus digitally modulated primary main subcarriers (subcarriers +356 to +546 and −356 to −546) and some or all primary extended subcarriers (subcarriers +280 to +355 and −280 to −355).

The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 4:
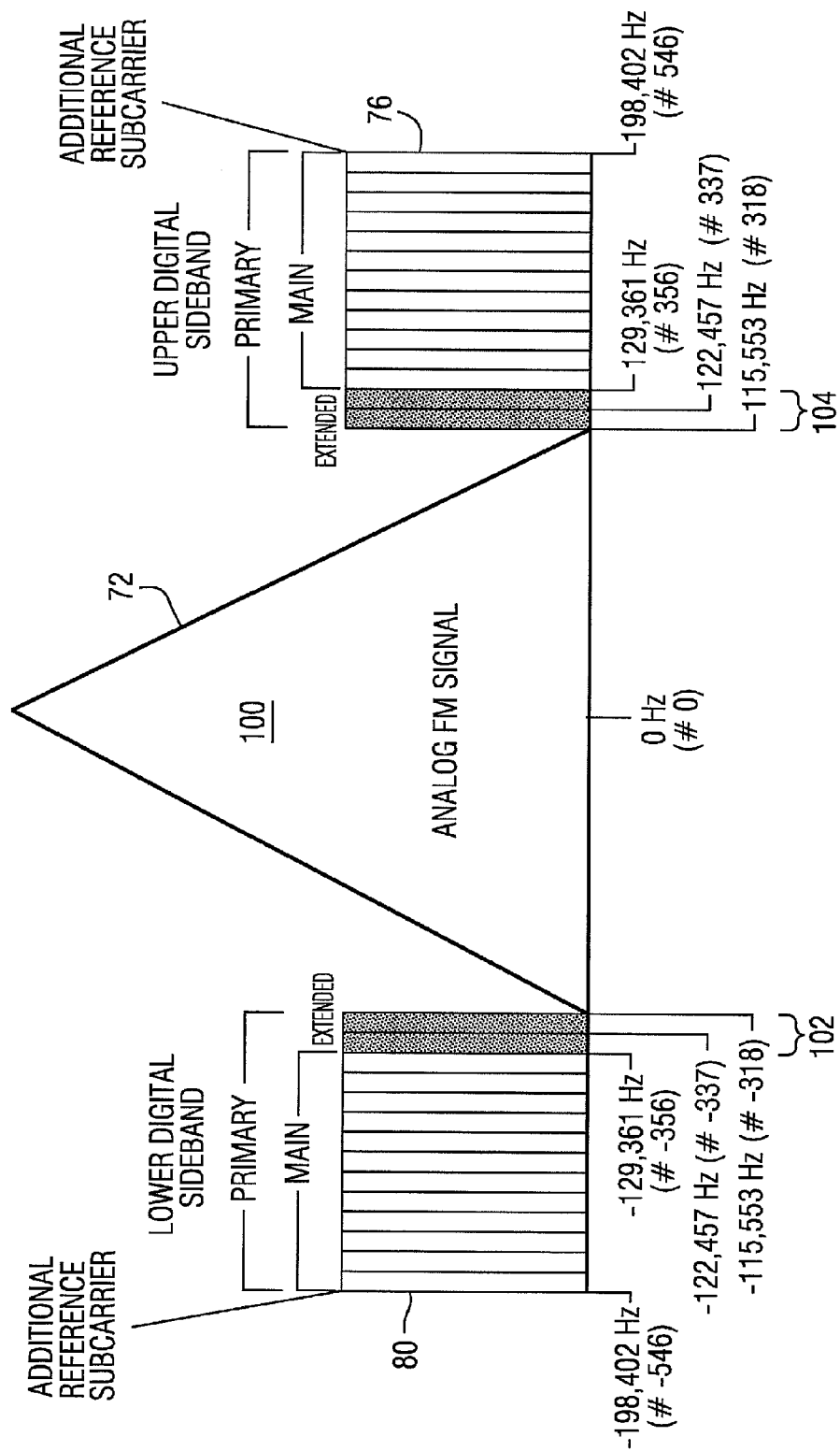
FIG. 4 is a schematic representation of another hybrid FM IBOC waveform.

FIG. 4 is a schematic representation of an extended hybrid FM IBOC waveform 100. The extended hybrid waveform is created by adding primary extended sidebands 102, 104 to the primary main sidebands present in the hybrid waveform. One, two, or four frequency partitions can be added to the inner edge of each primary main sideband. The extended hybrid waveform includes the analog FM signal plus digitally modulated primary main subcarriers (subcarriers +356 to +546 and −356 to −546) and some or all primary extended subcarriers (subcarriers +318 to +355 and −318 to −355).

The upper primary extended sidebands include subcarriers 337 through 355 (one frequency partition), or 318 through 355 (two frequency partitions). The lower primary extended sidebands include subcarriers −337 through −355 (one frequency partition), or −318 through −355 (two frequency partitions). The amplitude of each subcarrier can be scaled by an amplitude scale factor.

In each of the waveforms of FIGS. 2-4, the digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

In the illustrated hybrid waveforms, the digital signal is transmitted on a plurality of subcarriers in sidebands on either side of the analog FM signal. The power level of each sideband is appreciably below the total power in the analog FM signal. The analog signal may be monophonic or stereo, and may include subsidiary communications authorization (SCA) channels.

A Forward Error Correction (FEC) technique for an IBOC (In-Band On-Channel) digital radio system is presented here. This FEC code is referred to as Complementary Low-Density Parity Check (CLDPC) coding. The CLDPC coding is designed to accommodate the likely interference scenarios encountered in the IBOC broadcast channel.

Low Density Parity Check codes are a type of large block forward error correction (FEC) code. Because of their large size (typically many thousands of bits in each codeword), their error-correcting performance can approach the theoretical (Shannon) limit. It has been well-known that very large codes can approach this theoretical performance limit, but common techniques of encoding and decoding these codes were believed to be impractical before a few decades ago, when a practical iterative decoding technique for a specially constructed LDPC code was discovered. This suboptimum iterative decoding technique was based on "belief propagation", and the complexity was dramatically reduced by requiring a sparse parity check matrix along with some rules to ensure that all input information bits were sufficiently represented in the sparse parity checks. It is now well-known that this LDPC code with its construction restrictions, low-density, and simple suboptimum iterative decoding rules can still achieve performance near the theoretical limits. The performance and iterative nature of LDPC codes is similar to another class of iterative convolutional codes called "Turbo Codes".

LDPC codes are developed using various methods. There are regular and irregular LDPC codes created using various construction techniques. There are systematic and nonsystematic LDPC codes, where systematic codes contain all the original information bits in the codeword, as well as additional parity check code bits, and nonsystematic LDPC codes are comprised of only parity check code bits. Less common, an LDPC code can be constructed as a convolutional code, and can be terminated as a block, and decoded using a tail-biting termination. The convolutional LDPC code has similar performance to the block code, but is somewhat more flexible in the size of the coded block, as it can be terminated at an almost arbitrary size. The LDPC, block code size is fixed for each code (parity check matrix), whereas the convolutional LDPC code size can be terminated at different lengths without changing the generator (parity checks), All of these LDPC, code construction methods can be applicable to the CLDPC code described herein.

Both frequency and time diversity can be exploited in the IBOC transmitted signal to yield high performance in the presence of interference or fading. The digital signal modulation technique is coded orthogonal frequency division multiplexing (COFDM). This technique places a number of narrowband subcarriers on either end of the channel bandwidth, resulting in a Lower Sideband (LSB) and an Upper Sideband (USB). For time diversity, the information that is transmitted on the IBOC signal is divided into a Main channel and a Backup channel. The Main and Backup channels are separated in time. For frequency diversity, the Main and Backup channel information is transmitted on subcarriers in both the Lower and Upper Sidebands.

Since either the LSB or USB can be corrupted by a first adjacent signal (due to spectral crowding and frequency allocations in adjacent cities), the code used to transmit the Main and Backup channel information should permit sufficient decoding on one sideband when the other is corrupted. The same information is carried on each sideband, although they each use half of the CLDPC block code, and the corrupted half is effectively punctured. The half-size block code on each sideband is defined as a semi-codeword. The initial C in CLDPC refers to the complementary properties of the pair of semi-codewords comprising a composite CLDPC codeword. So each semi-codeword must also be a good LDPC code on its own. When both sidebands are available, the composite CLDPC codeword is more powerful than the semi-codewords. The full CLDPC code spanning both sidebands has a 3-dB energy advantage over one sideband, plus additional coding gain if the semi-codewords are not exact duplicates. Of course, sideband diversity gain is also an advantage in nonuniform interference, as well as frequency selective fading.

Time diversity can also be exploited to improve performance in fading and accommodate short signal blockages (e.g., traveling under a bridge). Time diversity is partially accomplished through block interleaving. However, some additional advantages are realized if the CLDPC code is again segmented into two or more semi-codewords. One semi-codeword (representing the Main channel information, defined as the Main semi-codeword, and abbreviated as M) is transmitted first with a relatively long interleaver, while the second semi-codeword (representing the Backup channel information, defined as the Backup semi-codeword, and abbreviated as B) is transmitted after several seconds with a shorter interleaver. This short interleaver should be on the order of 100 msec (instead of several seconds) to minimize tuning time and accommodate fast acquisition on the backup channel. This time diversity offers improved performance in fading, where both Main and Backup semi-codewords are less likely to be simultaneously corrupted. It also provides protection when losing the signal while a car is traveling under a bridge. A complete signal outage of less than the duration of the diversity delay can be tolerated. Additional semi-codewords L (representing information to be transmitted on the lower sideband) and U (representing information to be transmitted on the upper sideband) are described below.

The basic requirements for the CLDPC code include the ability to separate the original code in various, possibly overlapping, code partitions, where each partition comprises a semi-codeword. Semi-codewords are defined as Main, Backup, Lower and Upper (referred to herein as M, B, L and U partitions). Overlapping code partitions are code partitions that include at least some common bits. Each of the partitions must survive as a good code.

It is important to optimize the performance of the Main and Backup partitions as a pair of approximately symmetric, complementary non-overlapping partitions. Non-overlapping partitions are partitions that do not contain common bits. It is also important to optimize the performance of the Lower and Upper Sidebands as a pair of approximately symmetric, complementary non-overlapping partitions when both sidebands are used.

Of course, all code partitions should be noncatastrophic codes.

In one embodiment, the CLDPC codes can be created through partitioning of a longer (lower rate, e.g., $R=\frac{1}{3}$) LDPC code. However, it is also possible to Create this lower rate code by constructing it from shorter (higher rate) codes, to ensure that it can be partitioned. The FEC code requires appropriate puncture patterns to provide good results. The puncture pattern would provide code bits for the upper sideband and lower sideband complementary components. Each sideband is required to provide a good quality code in the case of the other sideband being corrupted. The code must also be partitioned for diversity with Main and Backup components. Each complementary component will be coded using a higher rate (e.g., rate $\frac{2}{3}$) code, producing a lower combined code rate (of $\frac{1}{3}$, for example).

Figure 5:
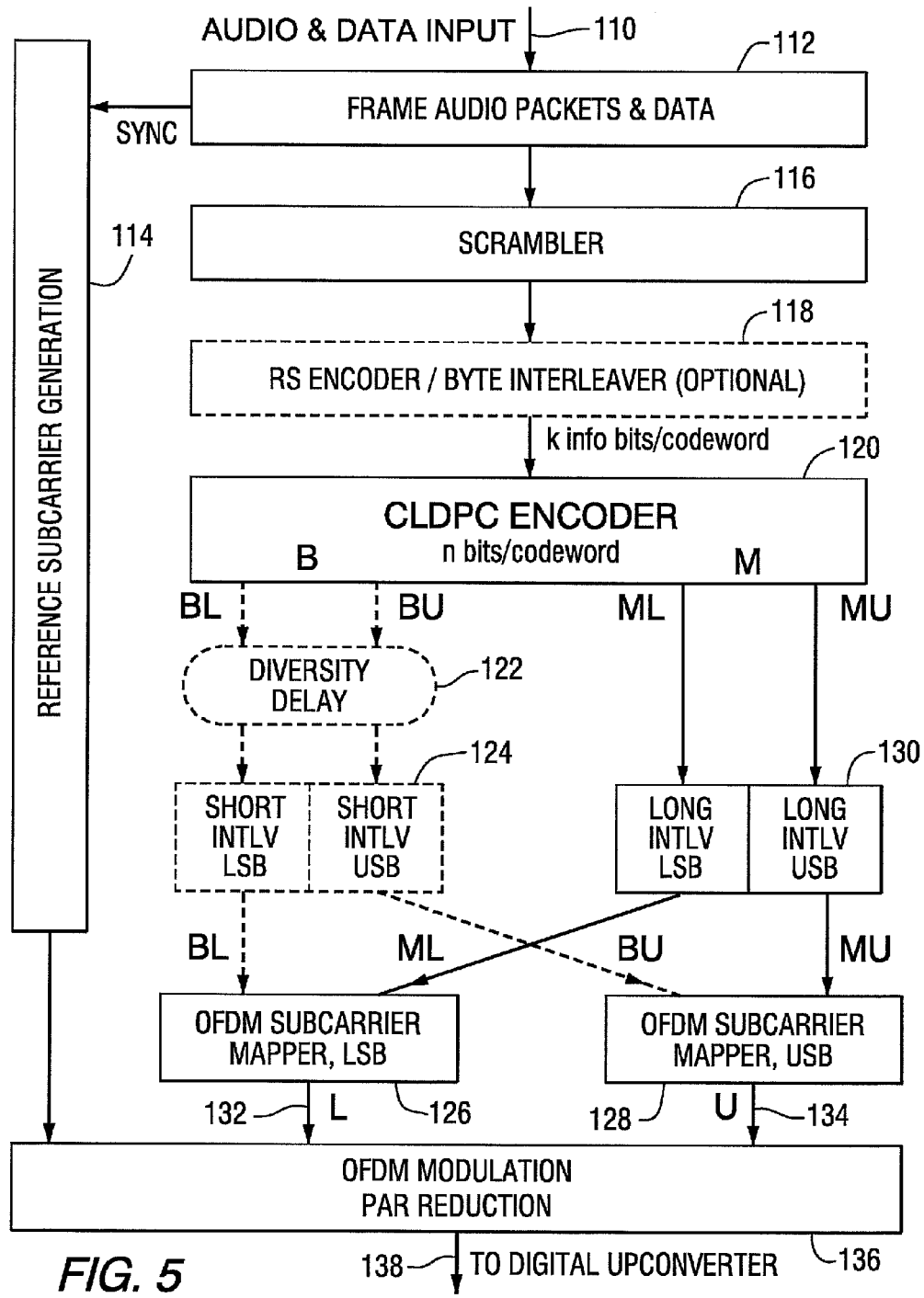
FIG. 5 is a diagram that illustrates a portion of the signal processing in an FM IBOC transmitter.

The FEC puncture pattern is distributed between a Main channel and a Backup channel. The Backup channel is used for fast tuning and provides time diversity to mitigate the effects of intermittent blockages. FIG. 5 is a diagram that illustrates a portion of the signal processing in an FM IBOC transmitter. Audio and data information are input as illustrated by arrow 110. This information is assembled into frames of audio packets and data as shown in block 112. Reference carriers (as described in U.S. Pat. No. 7,305,056 for "Coherent Tracking For FM In-Band On-Channel Receivers") are generated as shown in block 114 and synchronized with the audio and data frames. The information in the audio and data frames can be scrambled as shown in block 116, and optionally encoded and interleaved as shown in block 118 (if an outer code such as a Reed Solomon code is desired). This produces k information (plus optional RS) bits/codeword that are input to CLDPC encoder 120.

The CLDPC encoder processes the incoming bits to produce a plurality of semi-codewords having n bits/codeword. These CLDPC semi-codewords represent information to be transmitted on main M and backup B partitions, as well as the U and L partitions.

Groups of bits of the semi-codeword are assigned to a backup upper quarter-partition BU, a backup lower quarter-partition BL, a main upper quarter-partition MU and a main lower quarter-partition ML. Bits in the lower quarter-partitions are to be transmitted on subcarriers in the lower sideband of the IBOC signal and bits in the upper quarter-partitions are to be transmitted on subcarriers in the upper sideband of the IBOC signal. The upper backup and lower backup quarter-partitions are delayed 122 with respect to the upper main and lower main quarter-partitions, and interleaved as shown in block 124. The interleaved BL quarter-partition is mapped 126 to OFDM subcarriers in a lower sideband of the in-band on-channel radio signal, and the interleaved BU information is mapped 128 to OFDM subcarriers in an upper sideband of the in-band on-channel radio signal.

The main information is interleaved as shown in block 130. The interleaved ML quarter-partition is mapped 126 to OFDM subcarriers in a lower sideband of the in-band on-channel radio signal, and the interleaved MU quarter-partition is mapped 128 to OFDM subcarriers in an upper sideband of the in-band on-channel radio signal. The lower sideband symbols are then delivered on lines 132 and the upper sideband symbols are delivered on lines 134. The subcarriers are modulated and subject to peak-to-average power ratio reduction as shown in block 136 to produce a signal on line 138 that can be upconverted for transmission as an in-band on-channel radio signal, using for example, the transmitter shown in FIG. 1.

A CLDPC composite codeword is partitioned into independently-decodable "semi-codewords". The semi-codewords are separated into quarter-partitions where corruption due to interference and fading is typically uncorrelated. This is preferred over random interleaving (no partitioning) because semi-codewords are also good LDPC codes. Soft-decision decoding can be used for the entire codeword, while corrupted components are appropriately weighted or erased.

This allows decoding under most likely impaired conditions leaving at least one viable semi-codeword. The composite codeword has additional energy and coding gain when both semi-codewords are available.

There are generally 2 techniques for creating the CLDPC code. The first technique starts with a low-rate codeword (e.g., R=⅓). This low-rate codeword is then partitioned into semi-codewords (which can be designated as L, U, M and B) such that the semi-codewords (e.g., R=⅔) are independently decodable with "good" performance. Groups of bits of the semi-codewords are then assigned to 4 quarter-partitions: BL, BU, ML and MU, where L=BL+ML, U=BU+MU, M=ML+MU, and B=BL+BU. Since the semi-codewords are not generally systematic, performance of the semi-codewords should be checked. This technique should result in CLDPC codes having the highest combined performance, but with semi-codewords that may not be optimum because they are restricted by partitioning. Systematic CLDPC codes contain the information bits in each codeword, whereas nonsystematic CLDPC codes are comprised only of parity check bits. The performance of semi-codewords can be checked using, for example, a computer search.

Figure 6:
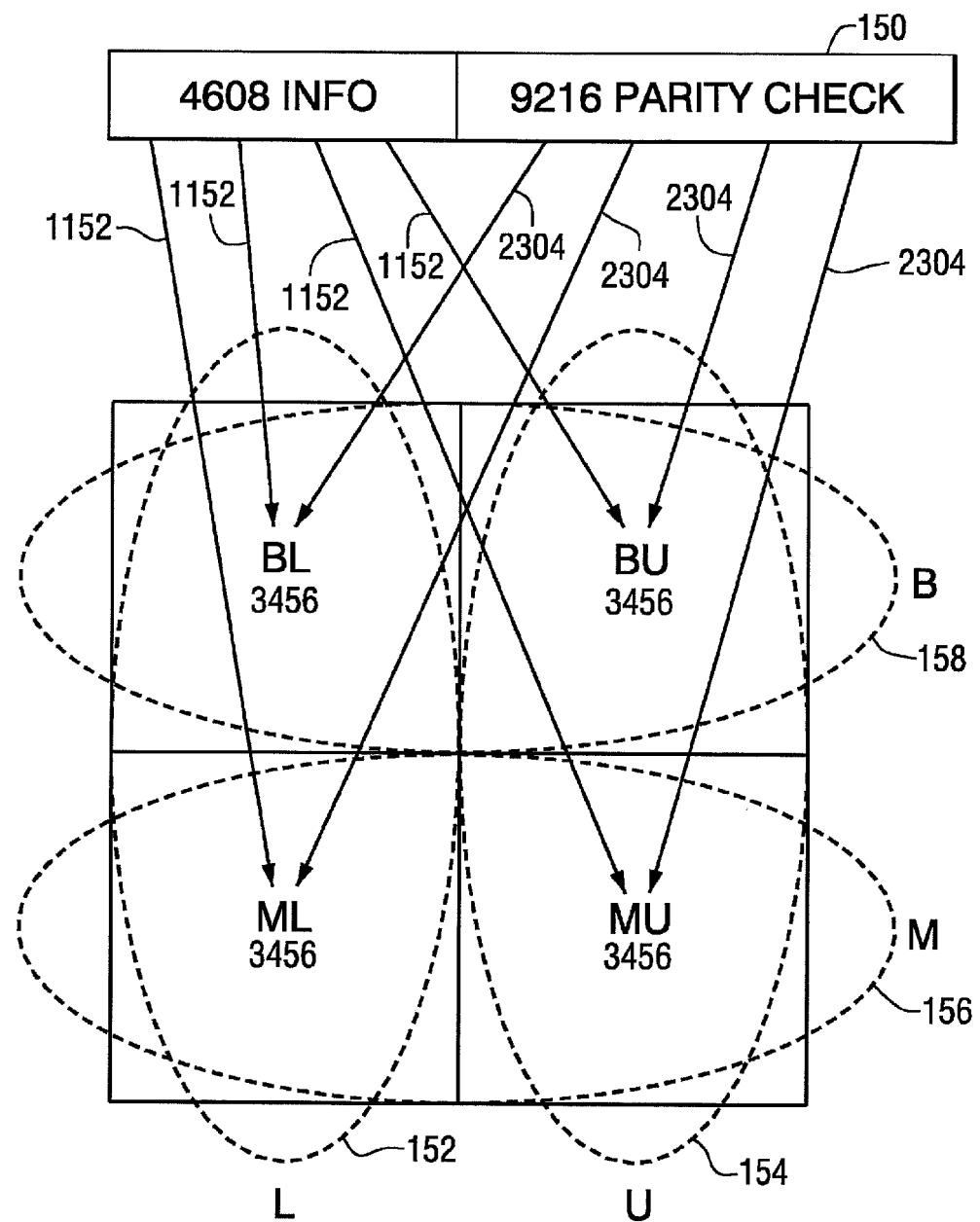
FIG. 6 is a schematic representation of an example of codeword partitioning.

The second technique starts by generating a B semi-codeword. The same information bits are then permuted and re-encoded to produce new parity check bits to form a complementary M semi-codeword. An L semi-codeword is then generated from the original information bits plus half of the parity bits from each B and M. Next, a U semi-codeword can be generated from the original information bits plus the remaining half of the parity bits, or just parity bits for a nonsystematic code. Then performance of L and U is verified, and parity bits are repartitioned if performance is not acceptable. This should result in CLDPC codewords having the highest semi-codeword performance for B and M, but the combined performance is not optimum because the information bits occur twice. Construction techniques used to create L and U can be swapped with techniques for creating B and M if single-sideband corruption is more likely than temporal outages. Systematic CLDPC codes contain the information bits in each codeword, whereas nonsystematic CLDPC codes are comprised only of parity check bits FIG. 6 is a schematic representation of an example of codeword partitioning of a rate ⅓ CLDPC code using Technique 1. In this example, a codeword 150 includes 4608 information bits and 9216 parity check bits. The information bits are divided into four groups of 1152 bits each. The parity bits are divided Into four groups of 2304 bits each. One of the groups of information bits and one of the groups of parity check bits are mapped to each BL (backup lower), BU (backup upper), ML (main lower) and MU (main upper) quarter-partition. The bits are selected such that they form nonsystematic rate ⅔ non-catastrophic semi-codewords identified as bits encompassed by ovals 152, 154, 156 and 158. These semi-codewords can be transmitted in the in-band on-channel radio signal illustrated in FIG. 4, which includes 84-kHz upper and lower sidebands, each having 229 subcarriers. The information throughput is approximately 100 kbps. The semi-codewords can be combined at a receiver to produce a composite rate ⅓ codeword. In this example, semi-codeword L includes one half of the bits of each of semi-codewords B and M, and semi-codeword U includes the other half of the bits of each of semi-codewords B and M.

FIG. 6 also shows 2-dimensional overlapping codeword partitioning. Frequency diversity is provided by the upper and lower sidebands, that transmit semi-codewords U and L. Time diversity is provided by Main/Backup semi-codewords M and B. BL, BU, ML and MU represent overlapped quarter-partitions. Each quarter-partition contains half of 2 semi-codewords. Each codeword bit is assigned to BL, BU, ML or MU. The composite codewords are composed of semi-codewords as: B=BL+BU, M=ML+MU, L=BL+ML, and U=BU+MU. Semi-codeword B can be transmitted after M with about a 4 sec diversity delay. The semi-codeword B is comprised of BL and BU.

Figure 7:
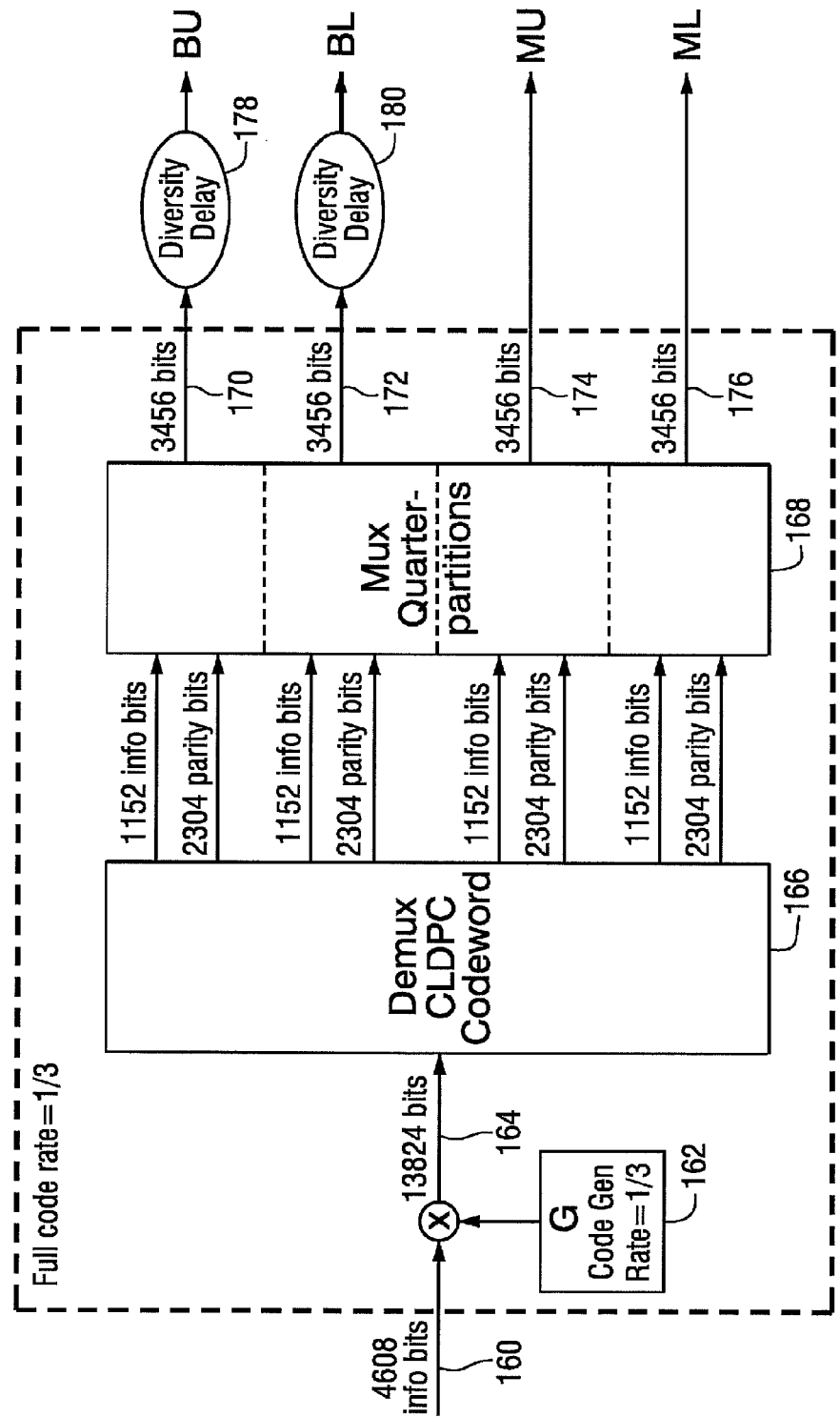
FIG. 7 is a block diagram of an example of complementary low density parity check (CLDPC) forward error correction (FEC) signal flow.

FIG. 7 is a block diagram of an example of CLDPC forward error correction (FEC) signal flow. In this example, 4608 information bits are input on line 160 and are encoded using a rate ⅓ code generator 162 to produce a CLDPC codeword having 13824 bits on line 164. The CLDPC codeword is demultiplexed 166 to produce the four groups of information bits and parity check bits illustrated in FIG. 6. These four groups of bits are multiplexed 168 to produce four groups of bits on lines 170, 172, 174 and 176 that are mapped to the BL, BU, ML and MU quarter-partitions. Diversity delays 178 and 180 are added to the bits for the BU and BL partitions.

Figure 8:
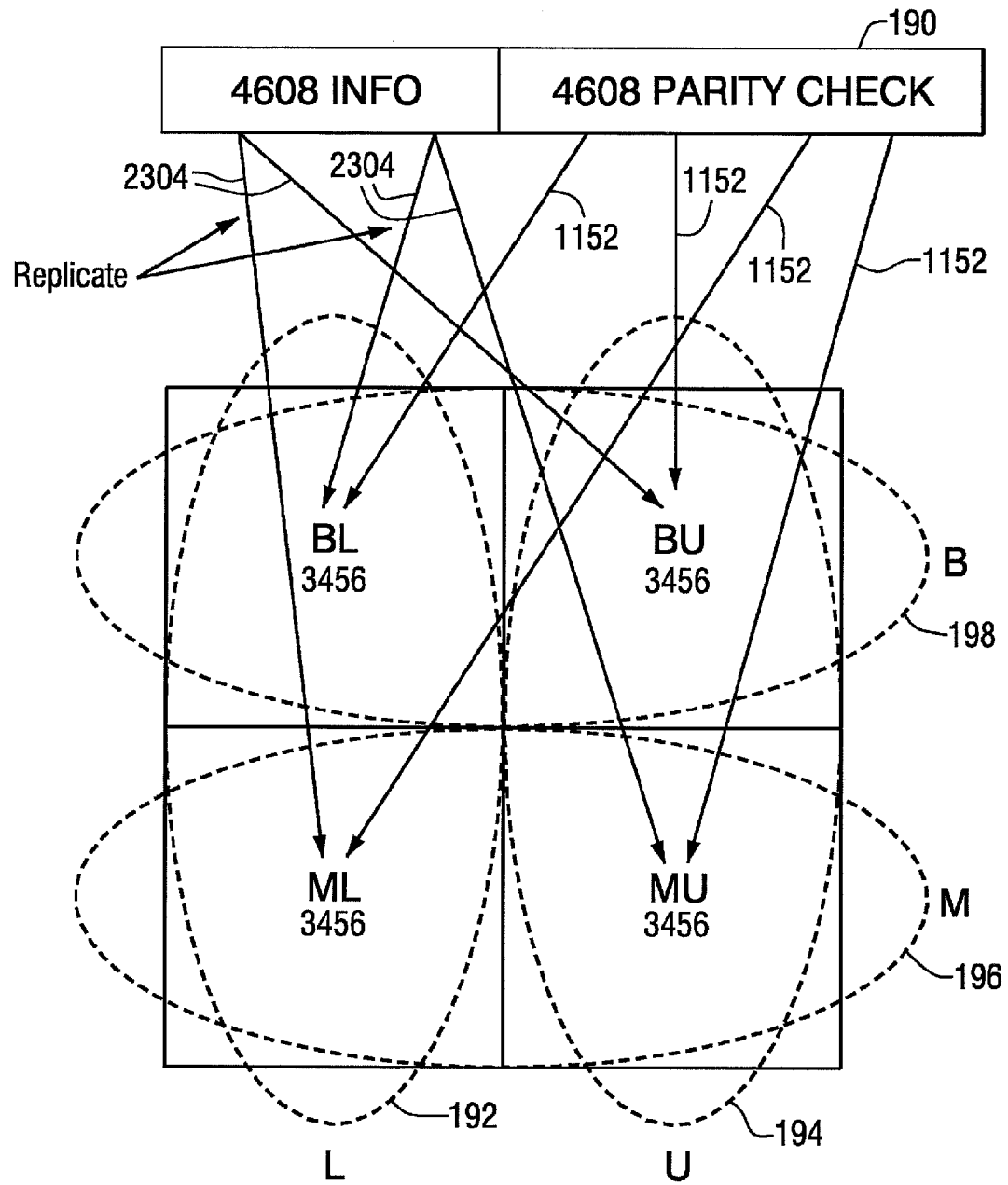
FIG. 8 is a schematic representation of another example of codeword partitioning.

FIG. 8 is a schematic representation of another example of codeword partitioning using a rate ½ CLDPC code (plus redundant information bits) using technique 2. In this example, a codeword 190 includes 4608 information bits and 4608 parity check bits. The information bits are divided into two groups of 2304 bits each. The parity bits are divided into four groups of 1152 bits each. One of the groups of information bits and one of the groups of parity check bits are mapped to each BL, BU, ML and MU quarter-partitions. Notice that the two groups of 2304 information bits are each redundantly mapped to two quarter-partitions. The bits are selected and mapped such that they form systematic rate ⅔ non-catastrophic semi-codewords identified as bits encompassed by ovals 192, 194, 196 and 198. These semi-codewords can be transmitted in the in-band on-channel radio signal illustrated in FIG. 4, which includes 84 kHz upper and lower sidebands, each having 229 subcarriers. The information throughput is approximately 100 kbps. The semi-codewords can be combined at a receiver to produce a composite rate ⅓ codeword.

Figure 9:
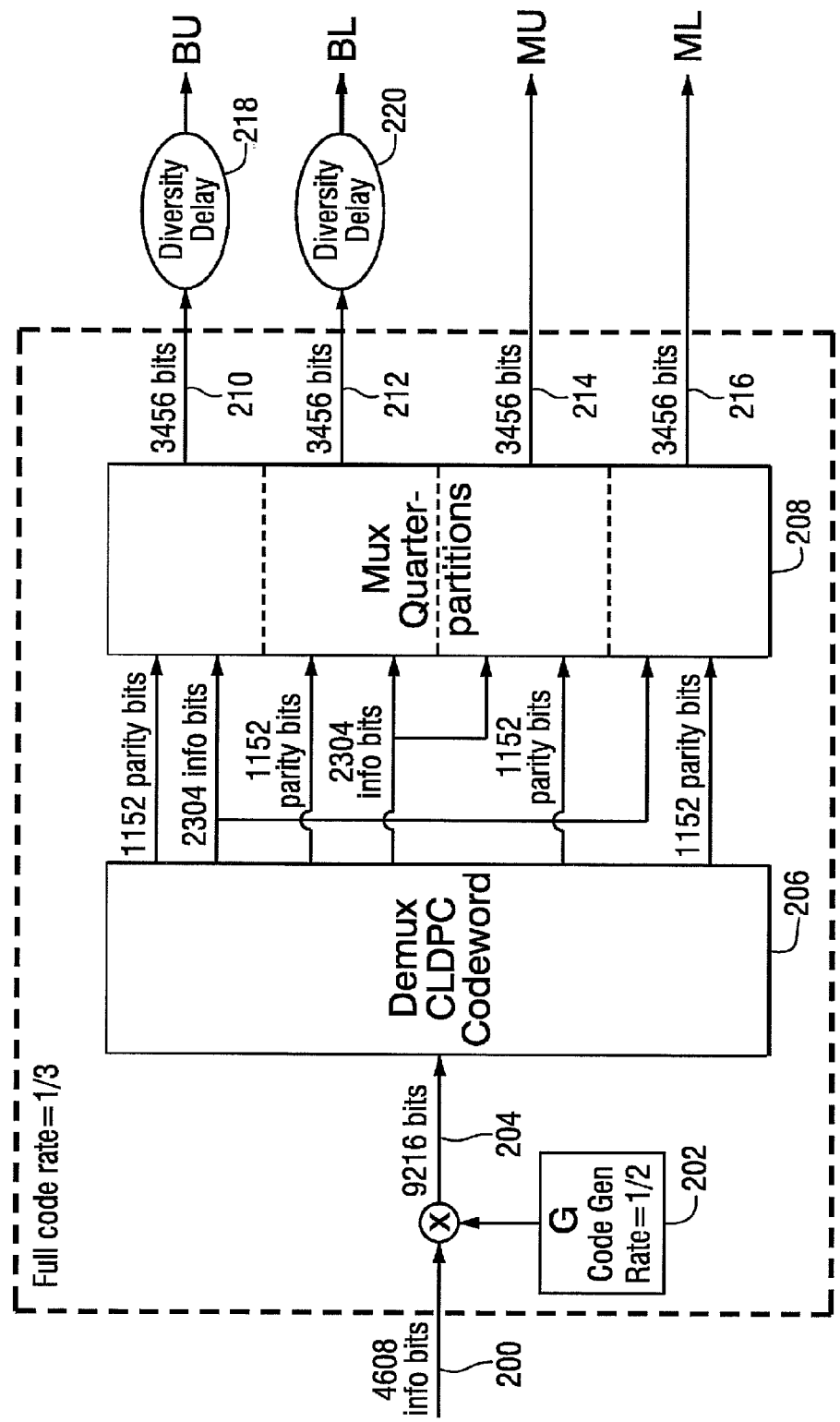
FIG. 9 is a block diagram of another example of CLDPC FEC signal flow.

FIG. 9 is a block diagram of an example of CLDPC forward error correction (FEC) signal flow. In this example, 4608 information bits are input on line 200 and are encoded using a rate ½ code generator 202 to produce a CLDPC codeword having 9216 bits on line 204. The CLDPC codeword is demultiplexed 206 to produce the four groups of information bits and parity check bits illustrated in FIG. 8. These four groups of bits are multiplexed into quarter partitions 208 to produce four groups of bits on lines 210, 212, 214 and 216 that are mapped to the BL, BU, ML and MU quarter-partitions. Diversity delays 218 and 220 are added to the bits for the BU and BL quarter-partitions.

Figure 10:
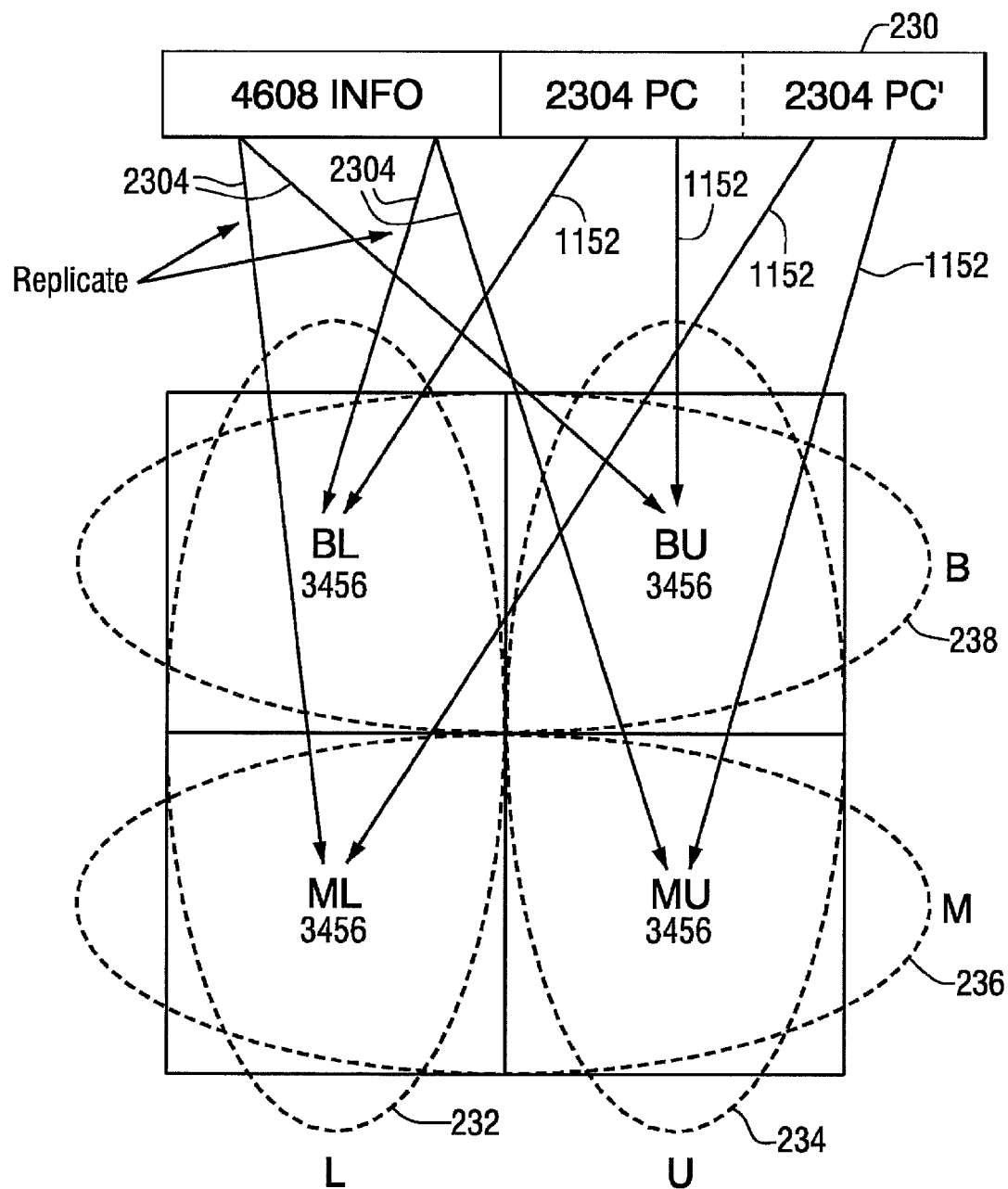
FIG. 10 is a schematic representation of another example of codeword partitioning.

FIG. 10 is a schematic representation of another example of codeword partitioning using a rate ½ CLDPC code. This is very similar to the codeword partitioning of FIG. 8, except in the way that the parity bits are generated. We start by generating an R=⅔ CLDPC codeword, and then create a second CLDPC codeword by simply permuting the information bits to form a new set of parity check bits. This results in a second R=⅔ CLDPC codeword with redundant information bits. The result is nearly the same as the partitioning of FIG. 8. The advantage here is that we need to define only a single good R=⅔ LDPC code, since the second codeword is created through permutation of the replicated information bits. In this example, a codeword 230 includes 4608 information bits and two groups of 2304 parity check bits. The information bits are divided into two groups of 2304 bits each. The parity bits are divided into four groups of 1152 bits each. One of the groups of information bits and one of the groups of parity check bits are mapped to each BL, BU, ML and MU quarter-partitions. Notice that the two groups of 2304 information bits are each redundantly mapped to two quarter-partitions. The bits are selected such that they form systematic rate ⅔ non-catastrophic semi-codewords identified as bits encompassed by ovals 232, 234, 236 and 238. These semi-codewords can be transmitted in the in-band on-channel radio signal illustrated in FIG. 4, which includes 84 kHz upper and lower sidebands, each having 229 subcarriers. The information throughput is approximately 100 kbps. The semi-codewords can be combined at a receiver to produce a composite rate ⅓ codeword.

Figure 11:
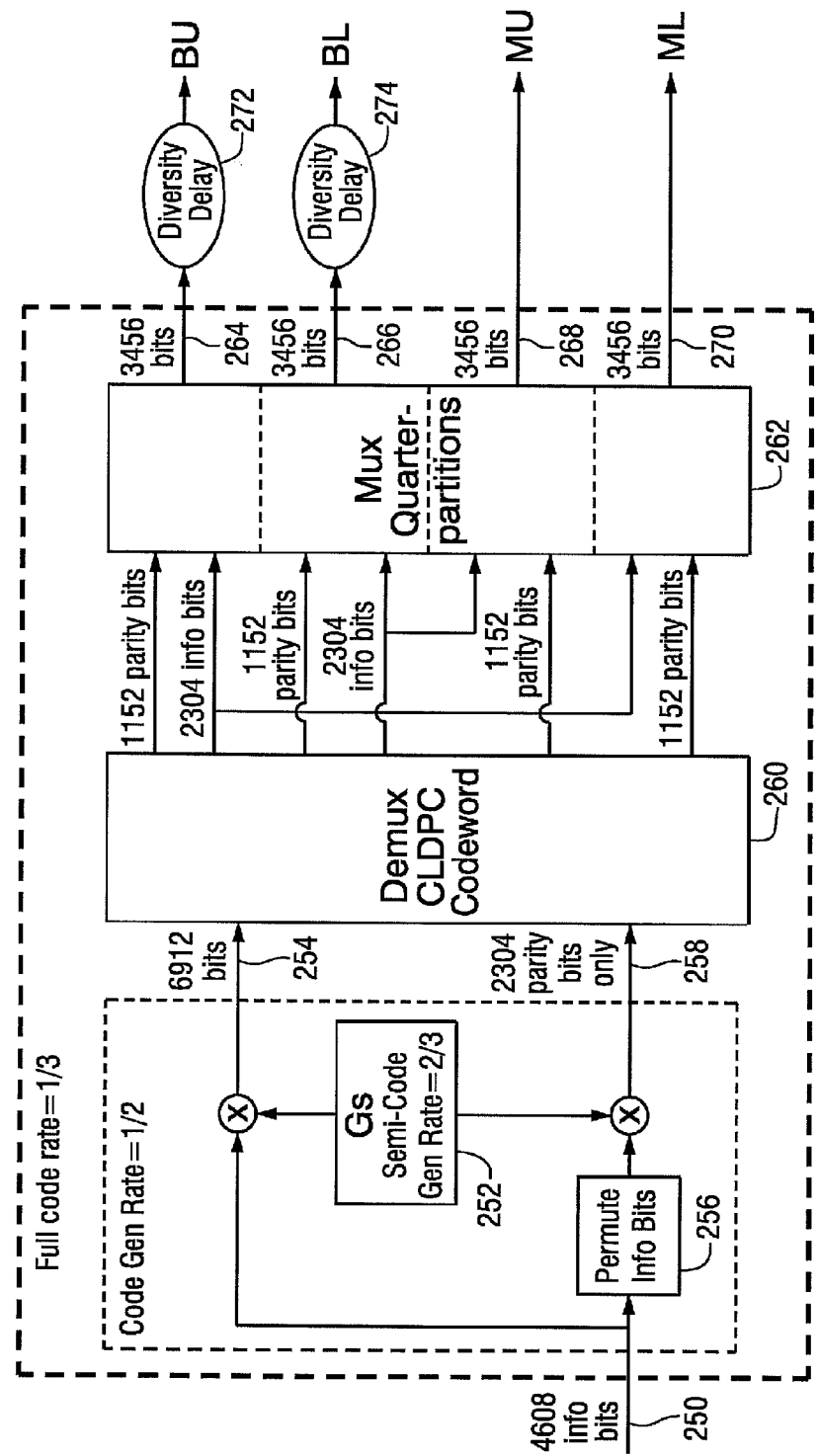
FIG. 11 is a block diagram of another example of CLDPC FEC signal flow.

FIG. 11 is a block diagram of an example of CLDPC forward error correction (FEC) signal flow. In this example, 4608 information bits are input on line 250 and are encoded using a rate ⅔ code generator 252 to produce a CLDPC codeword having 6912 bits on line 254. The information bits are also permutated as shown in block 256 and encoded using the ⅔ code generator to produce 2304 parity bits on line 258 (the information bits are not used). The CLDPC codeword and parity bits are demultiplexed 260 to produce the four groups of information bits and parity check bits illustrated in FIG. 10. These four groups of bits are multiplexed into quarter partitions 262 to produce four groups of bits on lines 264, 266, 268 and 270 that are mapped to the BL, BU, ML and MU quarter-partitions. Diversity delays 272 and 274 are added to the bits for the BU and BL partitions.

FIG. 11 starts with one systematic semi-codeword (e.g., B, R=⅔), permutes the same information bits, and re-encodes them to produce new parity check bits. Using the same information bits with these parity bits forms the complementary semi-codeword M, where B is the complement of M.

Figure 12:
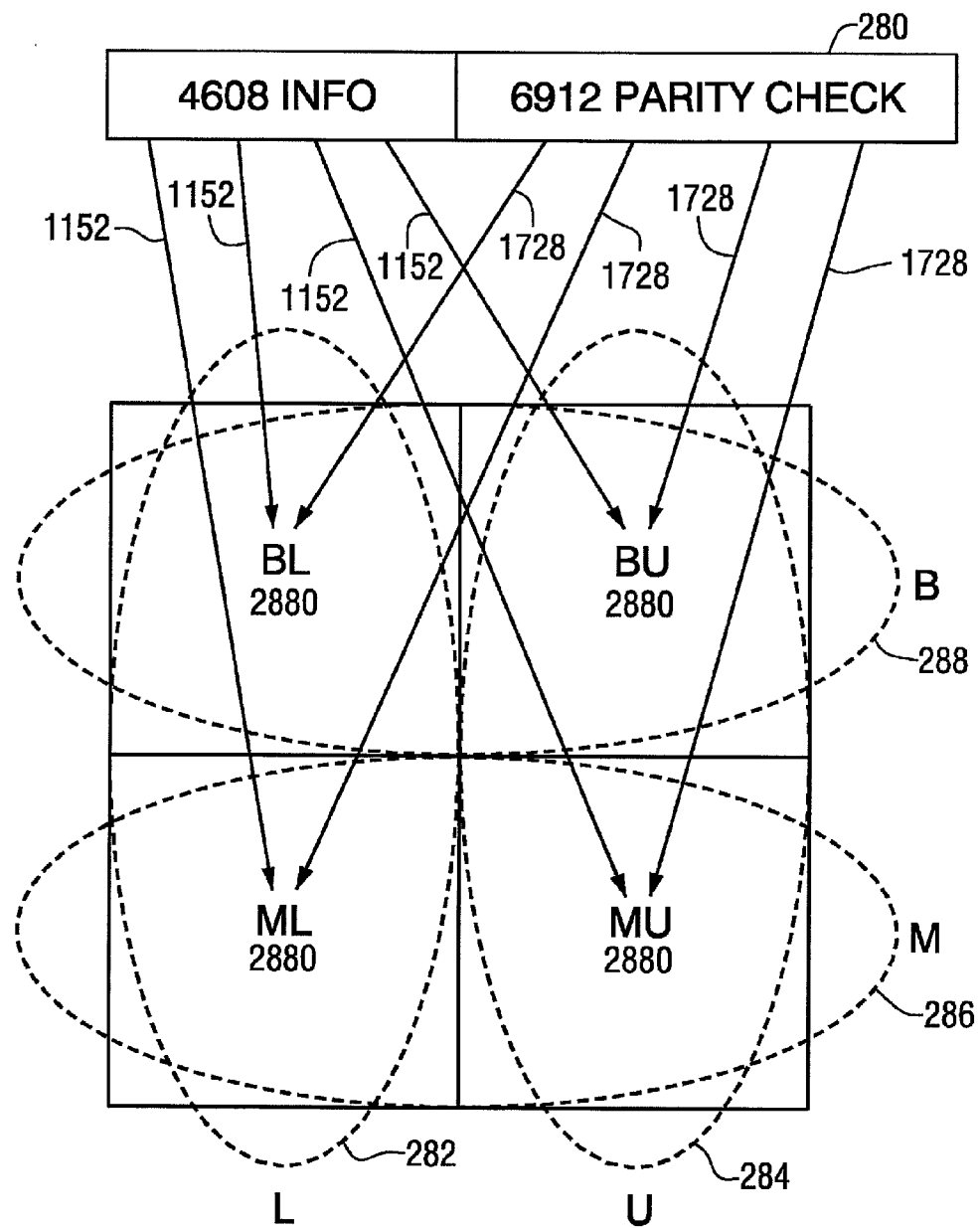
FIG. 12 is a schematic representation of another example of codeword partitioning.

FIG. 12 is a schematic representation of another example of codeword partitioning using Technique 1 and a rate ⅖ CLDPC code. It is similar to the partitioning of FIG. 6, except that it generates a higher rate CLDPC code (R=⅖ instead of R=⅓) which is more spectrally efficient. In this example, a codeword 280 includes 4608 information bits and 6912 parity check bits. The information bits are divided into four groups of 1152 bits each. The parity bits are divided into four groups of 1728 bits each. One of the groups of information bits and one of the groups of parity check bits are mapped to each BL, BU, ML and MU quarter-partition. The bits are selected such that they form nonsystematic rate ⅖ non-catastrophic semi-codewords identified as bits encompassed by ovals 282, 284, 286 and 288. These semi-codewords can be transmitted in the in-band on-channel radio signal illustrated in FIG. 2, which includes 70-kHz upper and lower sidebands, each having 191 subcarriers. The information throughput is approximately 100 kbps. The semi-codewords can be combined at a receiver to produce a composite rate ⅖ codeword.

Figure 13:
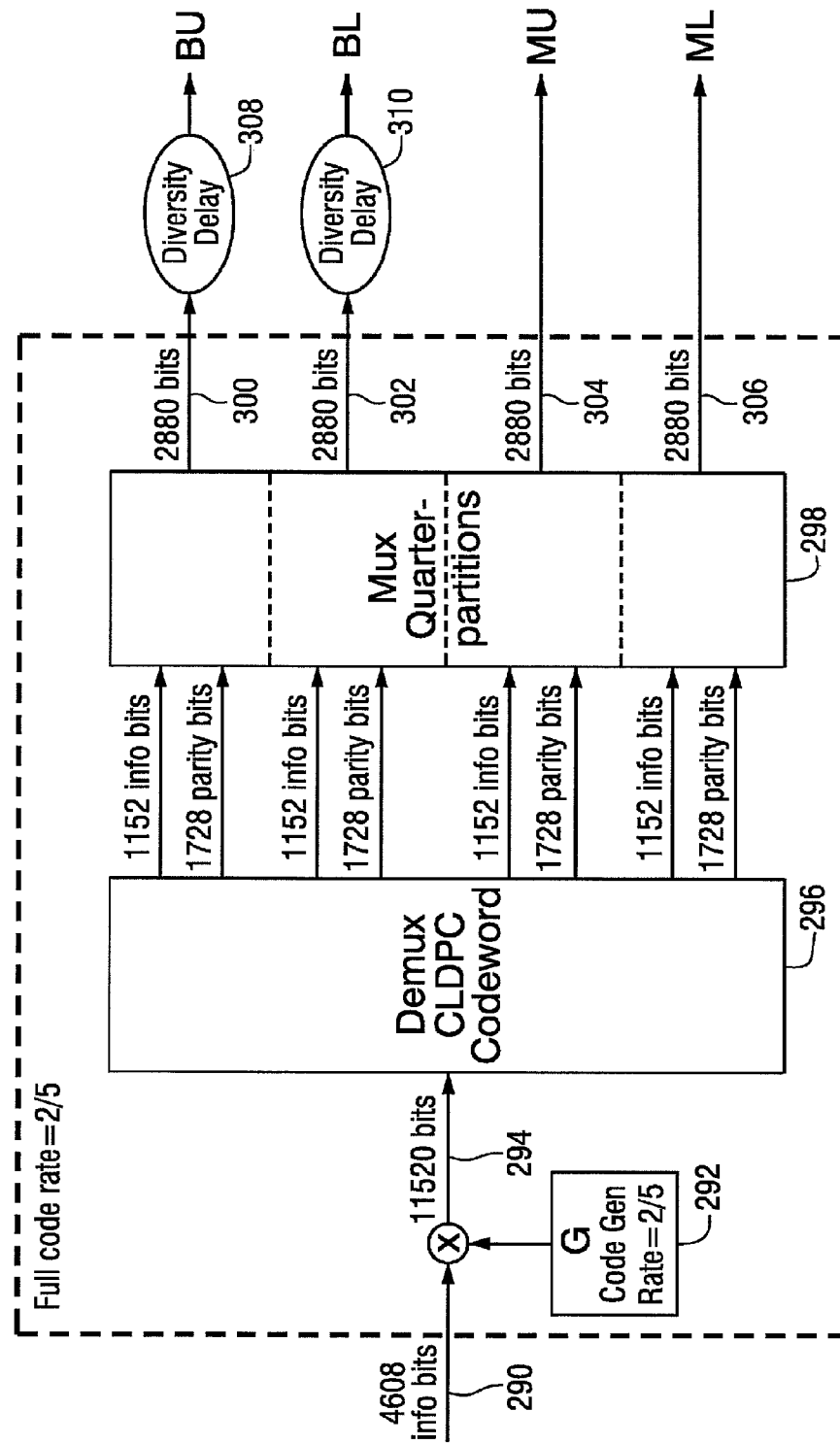
FIG. 13 is a block diagram of another example of CLDPC FEC signal flow.

FIG. 13 is a block diagram of an example of CLDPC forward error correction (FEC) signal flow. In this example, 4608 information bits are input on line 290 and are encoded using a rate ⅖ code generator 292 to produce a CLDPC codeword having 11520 bits on line 294. The CLDPC codeword is demultiplexed 296 to produce the four groups of information bits and parity check bits illustrated in FIG. 12. These four groups of bits are multiplexed into quarter partitions 298 to produce four groups of bits on lines 300, 302, 304 and 306 that are mapped to the BL, BU, ML and MU quarter-partitions. Diversity delays 308 and 310 are added to the bits for the BU and BL quarter-partitions.

Figure 14:
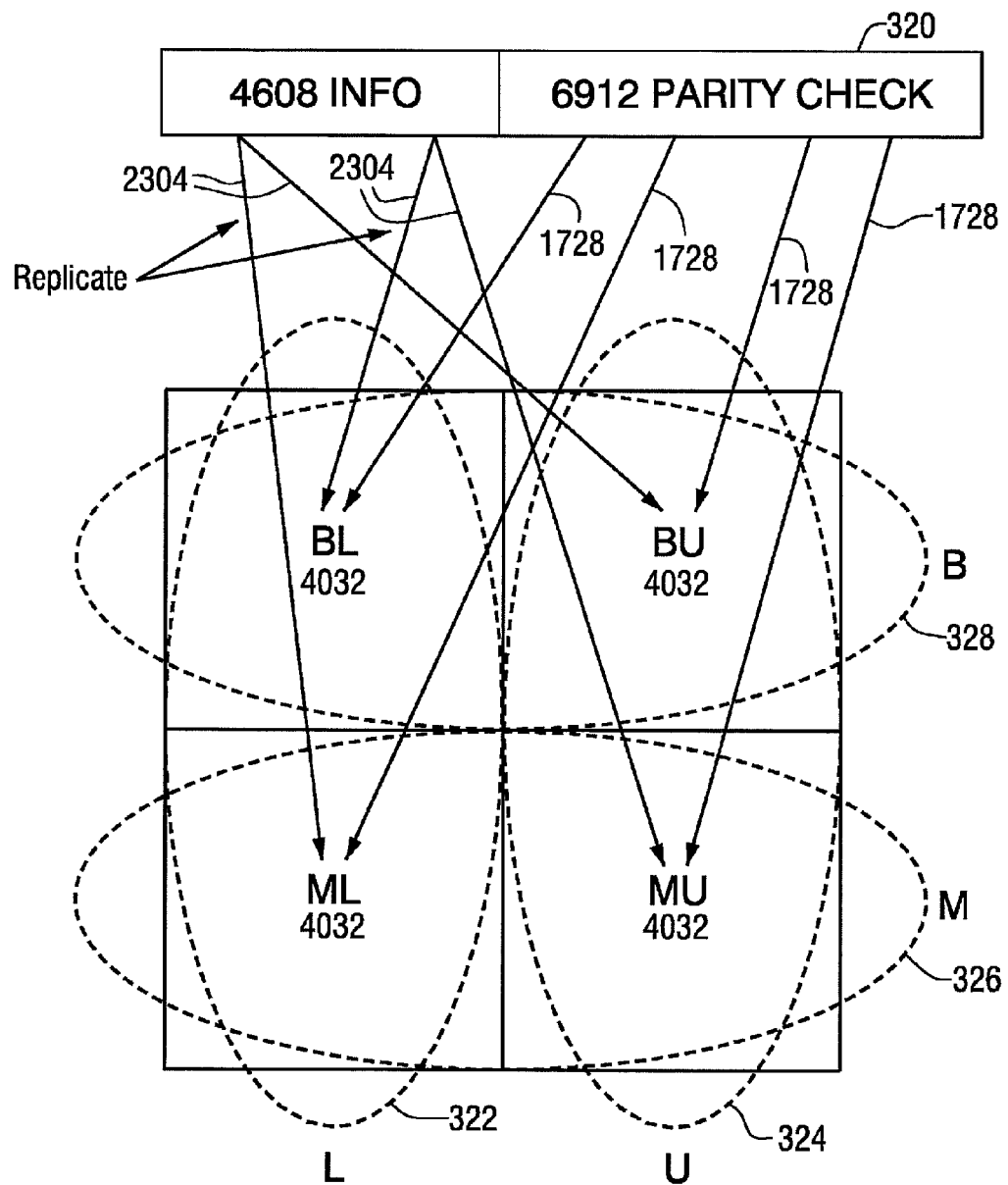
FIG. 14 is a schematic representation of another example of codeword partitioning.

FIG. 14 is a schematic representation of another example of codeword partitioning using Technique 2 and a rate ⅖ LDPC code. It is similar to the partitioning of FIG. 8, except that it generates a lower-rate CLDPC code. In this example, a codeword 320 includes 4608 information bits and 6912 parity check bits. The information bits are divided into two groups of 2304 bits each, which are replicated to produce four groups of 2304 bits each. The parity bits are divided into four groups of 1728 bits each. One of the groups of information bits and one of the groups of parity check bits are mapped to each BL, BU, ML and MU quarter-partitions. The bits are selected such that they form systematic rate 4/7 non-catastrophic semi-codewords identified as bits encompassed by ovals 322, 324, 326 and 328. These semi-codewords can be transmitted in the in-band on-channel radio signal illustrated in FIG. 3, which includes 98-kHz upper and lower sidebands, each having 267 subcarriers. The information throughput is approximately 100 kbps. The semi-codewords can be combined at a receiver to produce a composite rate 2/7 codeword. As an alternative embodiment, the partitioning can start with a rate 4/7 code and the information bits can be permuted to produce additional parity bits, in the same manner as shown in FIG. 10 and FIG. 11.

Figure 15:
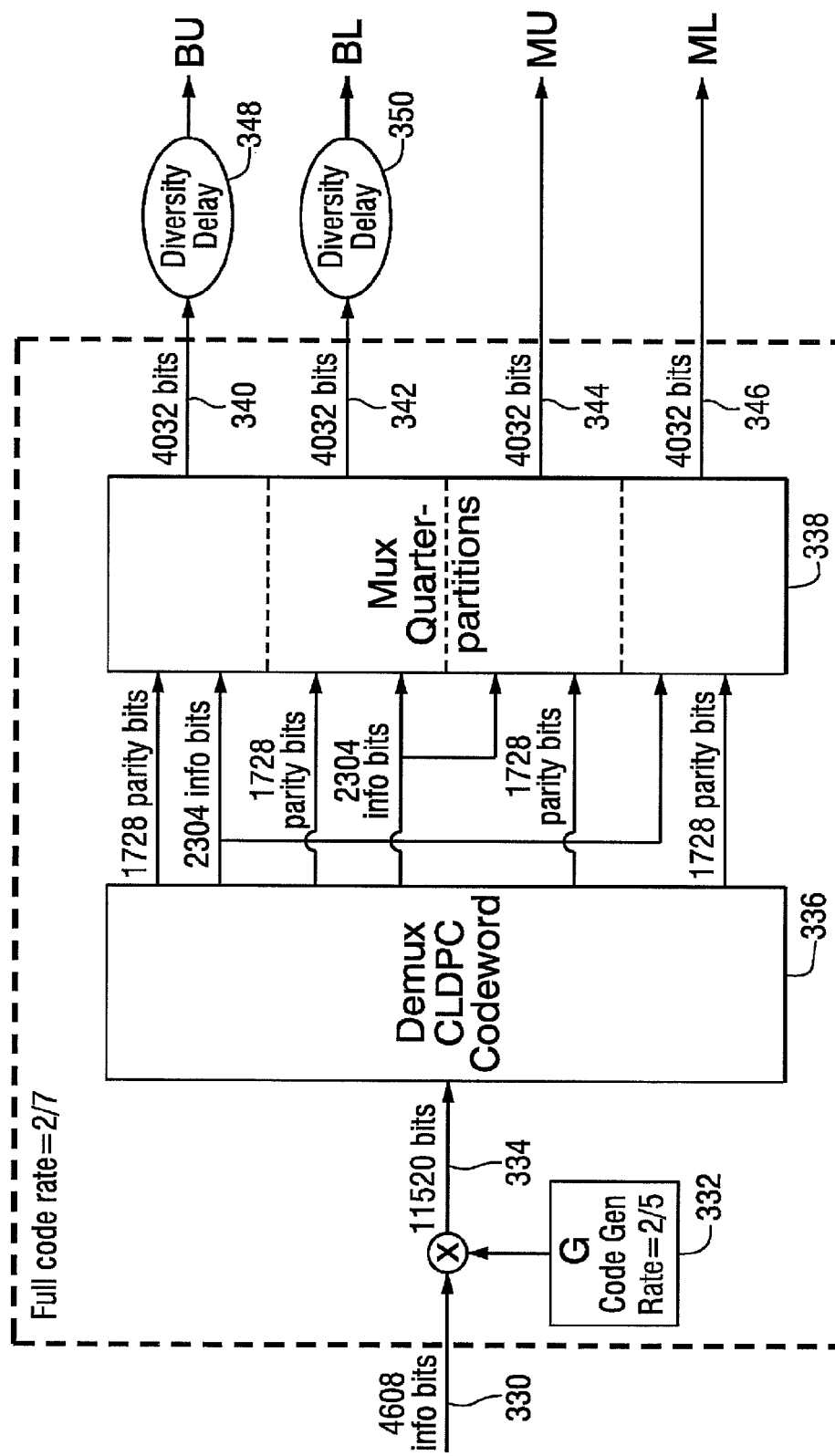
FIG. 15 is a block diagram of another example of CLDPC FEC signal flow.

FIG. 15 is a block diagram of an example of CLDPC forward error correction (FEC) signal flow. In this example, 4608 information bits are input on line 330 and are encoded using a rate ⅖ code generator 332 to produce a CLDPC codeword having 11520 bits on line 334. The CLDPC codeword is demultiplexed 336 to produce the four groups of information bits and parity check bits illustrated in FIG. 14. These four groups of bits are multiplexed into quarter partitions 338 to produce four groups of bits on lines 340, 342, 344 and 346 that are mapped to the BL, BU, ML and MU quarter-partitions. Diversity delays 348 and 350 are added to the bits for the BU and BL quarter-partitions.

Figure 16:
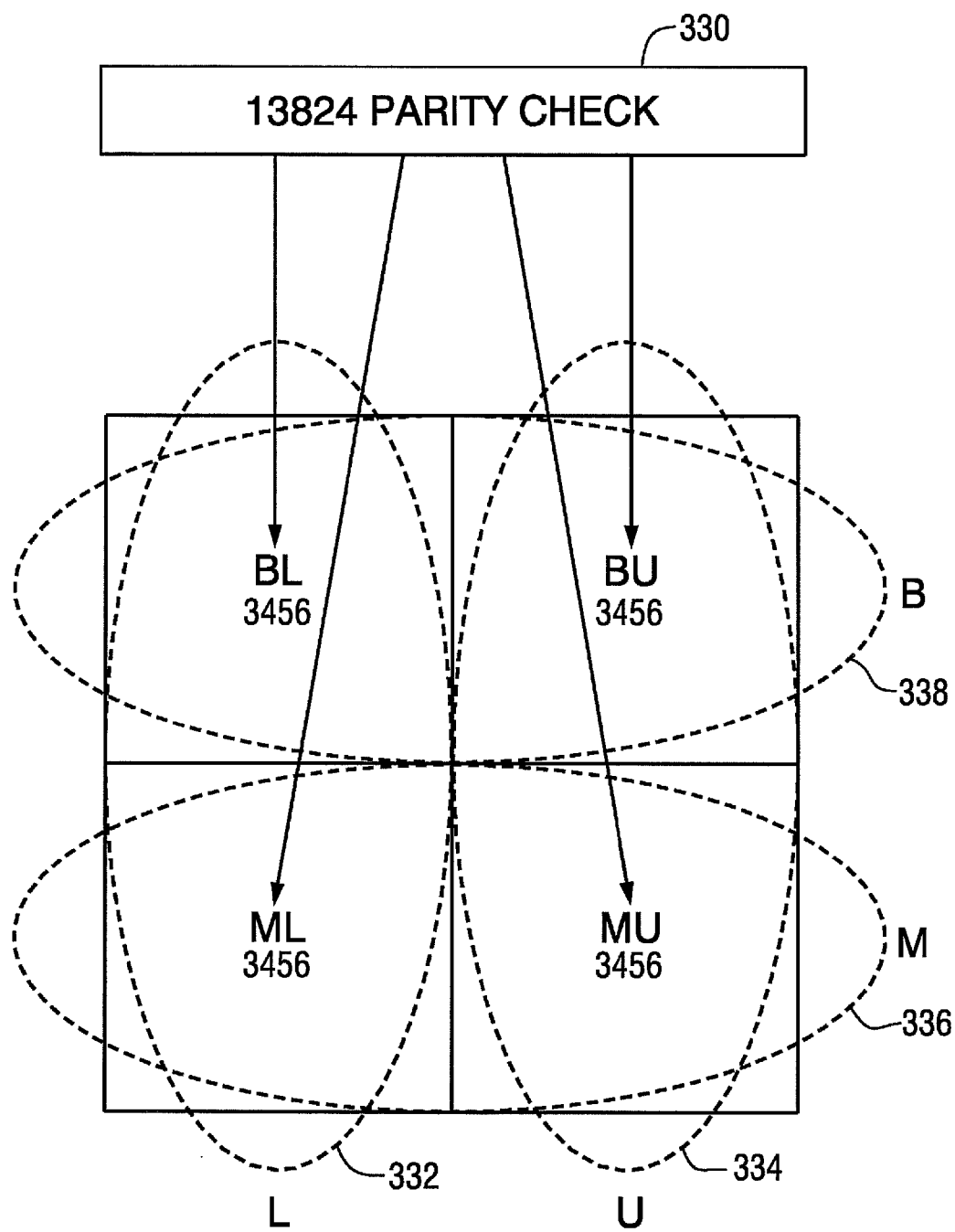
FIG. 16 is a schematic representation of another example of codeword partitioning.

FIG. 16 is similar to FIG. 6, except that it uses a nonsystematic CLDPC code where the information bits in the codeword are replaced by parity check code bits. FIG. 16 is a schematic representation of an example of codeword partitioning of a rate ⅓ CLDPC code using Technique 1. In this example, a codeword 320 includes 13824 parity check bits. The parity bits are divided into four groups of 3456 bits each. One of the groups of parity check bits is mapped to each BL (backup lower), BU (backup upper), ML (main lower) and MU (main upper) partitions. The bits are selected such that they form nonsystematic rate ⅔ non-catastrophic semi-codewords identified as bits encompassed by ovals 322, 324, 326 and 328. These semi-codewords can be transmitted in the in-band on-channel radio signal illustrated in FIG. 4, which includes 84-kHz upper and lower sidebands, each having 229 subcarriers. The information throughput is approximately 100 kbps. The semi-codewords can be combined at a receiver to produce a composite rate ⅓ codeword. In this example, semi-codeword L includes one half of the bits of each of semi-codewords B and M, and semi-codeword U includes the other half of the bits of each of semi-codewords B and M.

FIG. 16 also shows 2-dimensional overlapping codeword partitioning. Frequency diversity is provided by the upper and lower sidebands, that transmit semi-codewords U and L. Time diversity is provided by Main/Backup semi-codewords M and B. BL, BU, ML and MU represent overlapped quarter-partitions. Each quarter-partition contains half of 2 semi-codewords. Each codeword bit is assigned to BL, BU, ML or MU. The composite codewords are composed of semi-codewords as: B=BL+BU, M=ML+MU, L=BL+ML, and U=BU+MU. Semi-codeword B can be transmitted after M with about a 4 sec diversity delay. The semi-codeword B is comprised of BL and BU.

Table 1 summarizes the example LDPC codes used in the various embodiments described above.

TABLE 1

Comparison of Potential LDPC Codes

| Option | Bandwidth and information bit rate | Full code rate | Code Gen rate | Semi-code rate | Systematic semi-codewords* |
|---|---|---|---|---|---|
| 1 | 84 kHz 99.2 kbps | 1/3 | 1/3 | 2/3 | No |
| 2 | 84 kHz 99.2 kbps | 1/3 | 1/2 | 2/3 | Yes |
| 2a | 84 kHz 99.2 kbps | 1/3 | 1/2** | 2/3 | Yes |
| 3 | 70 kHz 99.2 kbps | 2/5 | 2/5 | 4/5 | No |
| 4 | 98 kHz 99.2 kbps | 2/7 | 2/5 | 4/7 | Yes |

Figure 17:
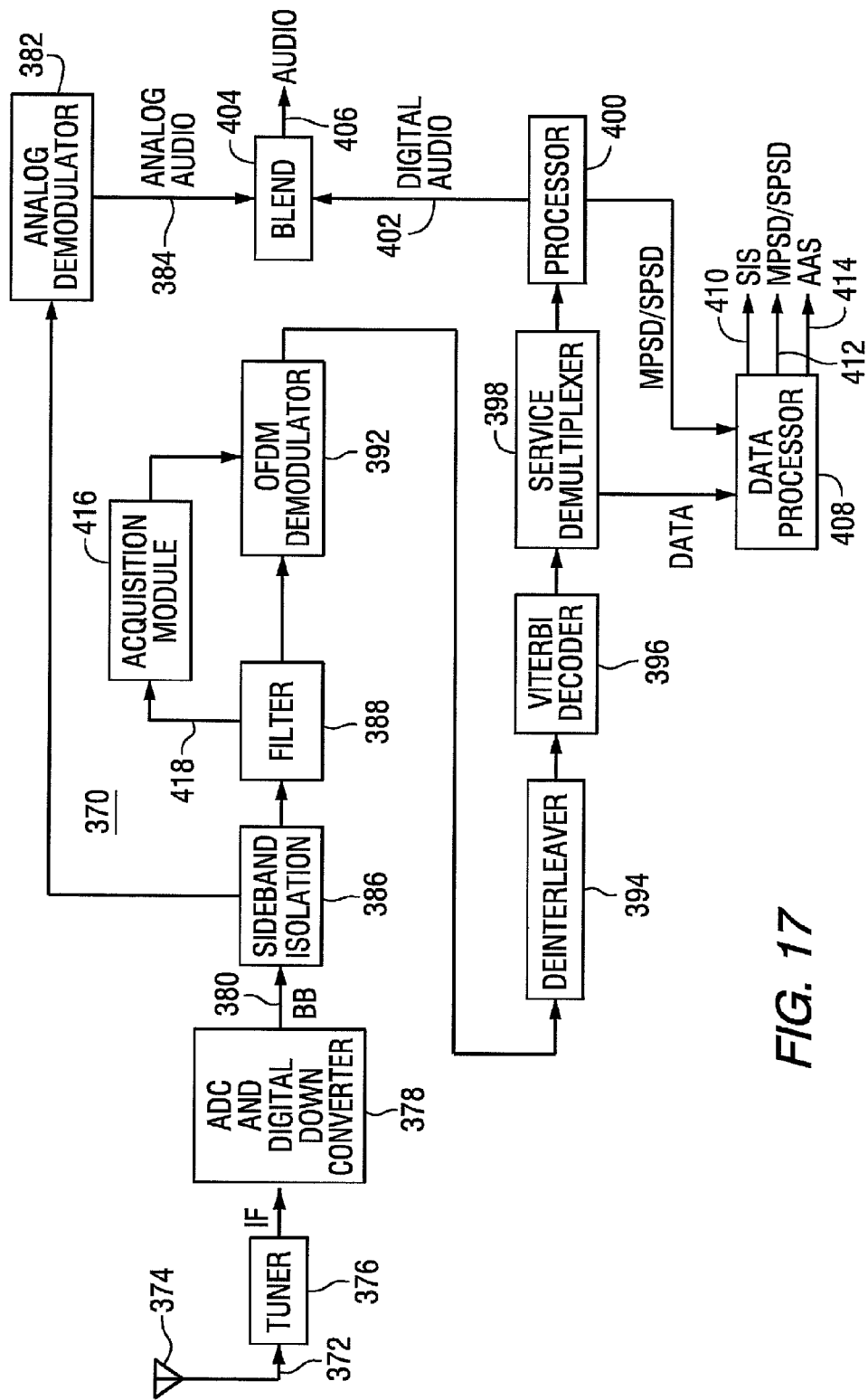
FIG. 17 is a functional block diagram of an FM IBOC DAB receiver.

*Systematic semi-codewords result in redundant information bits in the full code. The encoder replicates these redundant information bits, and the decoder combines redundant information soft-bits before decoding. Then the code generator rate is greater than the full code rate because of this redundancy.
**Rate-1/2 code generated using rate-2/3 generator with information-bit permutation and subsequent removal of 1 set of information bits FIG. 17 is a simplified functional block diagram of an FM IBOC receiver 370. The receiver includes an input 372 connected to an antenna 374 and a tuner or front end 376. A received signal is provided to an analog-to-digital converter and digital down converter 378 to produce a baseband signal at output 380 comprising a series of complex signal samples. The signal samples are complex in that each sample comprises a "real" component and an "imaginary" component, which is sampled in quadrature to the real component. An analog demodulator 382 demodulates the analog modulated portion of the baseband signal to produce an analog audio signal on line 384. The digitally modulated portion of the sampled baseband signal is next filtered by sideband isolation filter 386, which has a pass-band frequency response comprising the collective set of subcarriers $f_1$-$f_n$ present in the received OFDM signal. Filter 388 suppresses the effects of a first-adjacent interferer. Complex signal 418 is routed to the input of acquisition module 416, which acquires or recovers OFDM symbol timing offset, or error and carrier frequency offset or error from the received OFDM symbols as represented in the received complex signal. Acquisition module 416 develops a symbol timing offset Δt and carrier frequency offset Δf, as well as status and control information. The signal is then demodulated (block 392) to demodulate the digitally modulated portion of the baseband signal. Then the digital signal is deinterleaved by a deinterleaver 394, and decoded by a Viterbi decoder 396. A service demultiplexer 398 separates main and supplemental program signals from data signals. A processor 4002 processes the main and supplemental program signals to produce a digital audio signal on line 402. The analog and main digital audio signals are blended as shown in block 404, or the supplemental program signal is passed through, to produce an audio output on line 406. A data processor 408 processes the data signals and produces data output signals on lines 410, 412 and 414. The data signals can include, for example, a station information service (SIS), main program service data (MPSD), supplemental program service data (SPSD), and one or more advanced application services (AAS).

In practice, many of the signal processing functions described above, as well as the functions of the transmitter and receiver can be implemented using one or more processors or other components. Such components may include integrated circuits. As used herein, the term processor includes one or more processors or other components that are programmed or otherwise configured to perform the described functions.

The embodiments described above relate the use of complementary low density parity check codes in an FM IBOC radio system. However, it should be understood that the complementary low density parity check codes can also be used in or with an AM IBOC radio system, a single carrier radio signal, or other digital signals.

While the present invention has been described in terms of several embodiments, it will be understood by those skilled in the art that various modifications can be made to the described embodiments without departing from the scope of the invention as set forth in the claims.

What is claimed is:
1. A method comprising:
constructing complementary low density parity check codewords by generating a first codeword having a first code rate; and
partitioning the first codeword by assigning groups of bits of the first codeword to four quarter-partitions, wherein each of the quarter partitions includes bits in one half of one of four independently decodable semi-codewords each having a second code rate that is larger than the first code rate.
2. The method of claim 1, wherein the first codeword comprises information bits and parity check bits, and wherein the groups of bits assigned to each of the four quarter-partitions include a group of the information bits and a group of the parity bits.

3. The method of claim 1, further comprising:
transmitting bits of first and second ones of the four quarter-partitions on subcarriers in a lower sideband of an in-band on-channel signal; and
transmitting bits of and third and fourth ones of the four quarter-partitions on subcarriers in an upper sideband of the in-band on-channel signal.

4. The method of claim 1, wherein the first codeword comprises a systematic codeword.

5. The method of claim 1, wherein the first codeword comprises a non-systematic codeword.

6. The method of claim 1, further comprising:
performance checking the semi-codewords; and
repartitioning the first codeword if the semi-codewords do not meet predetermined performance criteria.

7. A method comprising:
constructing complementary low density parity check codewords by generating a first semi-codeword including information bits and first parity bits;
permuting and re-encoding the information bits of the first semi-codeword to produce second parity check bits and forming a second semi-codeword including the information bits and second parity bits;
generating a third semi-codeword from the information bits of the first semi-codeword plus a first half of the parity bits from each of the first semi-codeword and the second semi-codeword; and
generating a fourth semi-codeword from the information bits of the first semi-codeword plus a second half of the parity bits from each of the first semi-codeword and the second semi-codeword.

8. The method of claim 7, further comprising:
assigning groups of bits of the first, second, third and fourth semi-codewords to each of four quarter-partitions, wherein each of the quarter partitions includes bits in one half of one of the first, second, third and fourth codewords.

9. The method of claim 7, further comprising:
transmitting bits of first and second ones of the four quarter-partitions on subcarriers in a lower sideband of an in-band on-channel signal; and
transmitting bits of third and fourth ones of the four quarter-partitions on subcarriers in an upper sideband of the in-band on-channel signal.

10. The method of claim 7, further comprising:
performance checking the first and second semi-codewords; and
repartitioning the parity bits of the second semi-codeword if the first and second semi-codewords do not meet predetermined performance criteria.

11. A receiver for receiving a digital radio signal, the receiver comprising:
an input for receiving a radio signal including at least one carrier, the carrier being modulated by plurality of information bits representing audio information and/or data encoded in a plurality of complementary low density parity check codewords including a first codeword having a first code rate; wherein the first codeword is partitioned by assigning groups of bits of the first codeword to four quarter-partitions, and wherein each of the quarter partitions includes bits in one half of one of four independently decodable semi-codewords each having a second code rate that is larger than the first code rate; and
a processor for producing an output signal in response to the received radio signal.

12. The receiver of claim 11, wherein:
the first codeword comprises information bits and parity check bits; and
the groups of bits assigned to each of the four quarter-partitions include a group of the information bits and a group of the parity bits.

13. The receiver of claim 11, wherein:
first and second ones of the four quarter-partitions are received on subcarriers in a lower sideband of an in-band on-channel signal; and
second and third ones of the four quarter-partitions are received on subcarriers in an upper sideband of the in-band on-channel signal.

14. The receiver of claim 11, wherein the first codeword comprises a systematic codeword.

15. The receiver of claim 11, wherein the first codeword comprises a non-systematic codeword.

* * * * *